(12) United States Patent
Daraeizadeh et al.

(10) Patent No.: US 11,550,977 B2
(45) Date of Patent: Jan. 10, 2023

(54) APPARATUS AND METHOD FOR QUANTUM PERFORMANCE AND/OR ERROR CORRECTION ENHANCEMENT USING MULTI-QUBIT GATES

(71) Applicant: Intel Corporation, Santa Clara, CA (US)

(72) Inventors: Sahar Daraeizadeh, Lake Oswego, OR (US); Anne Matsuura, Portland, OR (US); Xiang Zou, Hillsboro, OR (US); Sonika Johri, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 755 days.

(21) Appl. No.: 16/261,113

(22) Filed: Jan. 29, 2019

(65) Prior Publication Data

US 2020/0242208 A1 Jul. 30, 2020

(51) Int. Cl.
| | | |
|---|---|---|
| *G06F 11/00* | (2006.01) | |
| *G06F 30/30* | (2020.01) | |
| *G06N 10/00* | (2022.01) | |
| *G11C 29/52* | (2006.01) | |
| *G06F 11/10* | (2006.01) | |
| *G06N 10/70* | (2022.01) | |

(52) U.S. Cl.
CPC .......... *G06F 30/30* (2020.01); *G06F 11/1068* (2013.01); *G06N 10/00* (2019.01); *G06N 10/70* (2022.01); *G11C 29/52* (2013.01)

(58) Field of Classification Search
CPC ..... G06F 30/30; G06F 11/1068; G11C 29/52; G06N 10/00
See application file for complete search history.

(56) References Cited

U.S. PATENT DOCUMENTS

| | | | |
|---|---|---|---|
| 2017/0228483 A1* | 8/2017 | Rigetti | ................... G06F 30/367 |
| 2019/0049495 A1* | 2/2019 | Ofek | ................... G01R 33/1284 |

OTHER PUBLICATIONS

Bacon, "Operator Quantum Error-correcting Subsystems for Self-correcting Quantum Memories", The American Physical Society, Physical Review A, vol. 73, 2006, pp. 012340-1-012340-13.
(Continued)

*Primary Examiner* — Samir W Rizk
(74) *Attorney, Agent, or Firm* — Nicholson De Vos Webster & Elliott LLP

(57) ABSTRACT

Apparatus and method for replacing portions of a quantum circuit with multi-qubit gates. For example, one embodiment of an apparatus comprises: a quantum circuit analyzer to evaluate an original quantum circuit specification including one or more sub-circuits of the original quantum circuit specification, the quantum circuit analyzer to generate results of the evaluation; a quantum circuit generator to generate a new quantum circuit specification based on the results of the evaluation generated by the quantum circuit analyzer, the quantum circuit generator to generate the new quantum circuit specification by, at least in part, replacing the one or more sub-circuits of the original quantum circuit specification with one or more multi-qubit gates.

24 Claims, 19 Drawing Sheets

(56) References Cited

OTHER PUBLICATIONS

Calderbank et al., "Good Quantum Error-correcting Codes Exist", The American Physical Society, Physical Review A, vol. 54, No. 2, Aug. 1996, pp. 1098-1105.
Chong et al., "Programming Languages and Compiler Design for Realistic Quantum Hardware", Nature, vol. 549, Sep. 14, 2017, pp. 180-187.
Cohen et al., "Multi-qubit Gate with Trapped Ions for Microwave and Laser-based Implementation", New Journal of Physics, vol. 17, 2015, No. 043008, pp. 1-13.
Dennis et al., "Topological Quantum Memory", American Institute of Physics, Journal of Mathematical Physics, vol. 43, No. 9, Sep. 2002, pp. 4452-4505.
Fowler et al., "Surface Codes: Towards Practical Large-scale Quantum Computation", The American Physical Society, Physical Review A, vol. 86, 2012, pp. 032324-1-032324-48.
Fu et al., "A Heterogeneous Quantum Computer Architecture", Proceedings of the ACM International Conference on Computing Frontiers, May 2016, 9 pages.
Fu et al., "A Microarchitecture for a Superconducting Quantum Processor", IEEE Micro, May/Jun. 2018, pp. 40-47.
Gottesman, "Stabilizer Codes and Quantum Error Correction", California Institute of Technology, Pasadena, California, 2004, 122 pages.
Hastings et al., "Improving Quantum Algorithms for Quantum Chemistry", arXiv:1403.1539v2 [quant-ph], 2014, 12 pages.
Kelly et al., "State Preservation by Repetitive Error Detection in a Superconducting Quantum Circuit", Nature, vol. 519, Mar. 5, 2015, pp. 66-69.
Kumar, "Direct Implementation of an N-qubit Controlled-unitary Gate in a Single Step", Quantum Inf. Process, vol. 12, 2013, pp. 1201-1223.
Nielsen et al., "Quantum Computation and Quantum Information", 10th Anniversary Edition, Cambridge University Press, 2010, 704 pages.
O'Malley et al., "Scalable Quantum Simulation of Molecular Energies", The American Physical Society, Physical Review X, vol. 6, 2016, pp. 031007-1-031007-13.
Shor, "Scheme for Reducing Decoherence in Quantum Computer Memory", The American Physical Society, Physical Review A, vol. 52, No. 4, Oct. 1995, pp. R2493-R2496.
Steane, "Error Correcting Codes in Quantum Theory", The American Physical Society, Physical Review Letters, vol. 77, No. 5, Jul. 29, 1996, pp. 793-797.
Terhal, "Quantum Error Correction for Quantum Memories", arXiv:1302.3428v7 [quant-ph], 2015, pp. 1-47.
Versluis, Richard, et al., Scalable quantum circuit and control for a superconducting surface code, Dec. 24, 2016, Physical Review Applied 8.3, 2017.†
Roffe, Joschka, et al., Protecting quantum memories using coherent parity check codes, Quantum Science and Technology 3.3 (2018).†

\* cited by examiner
† cited by third party

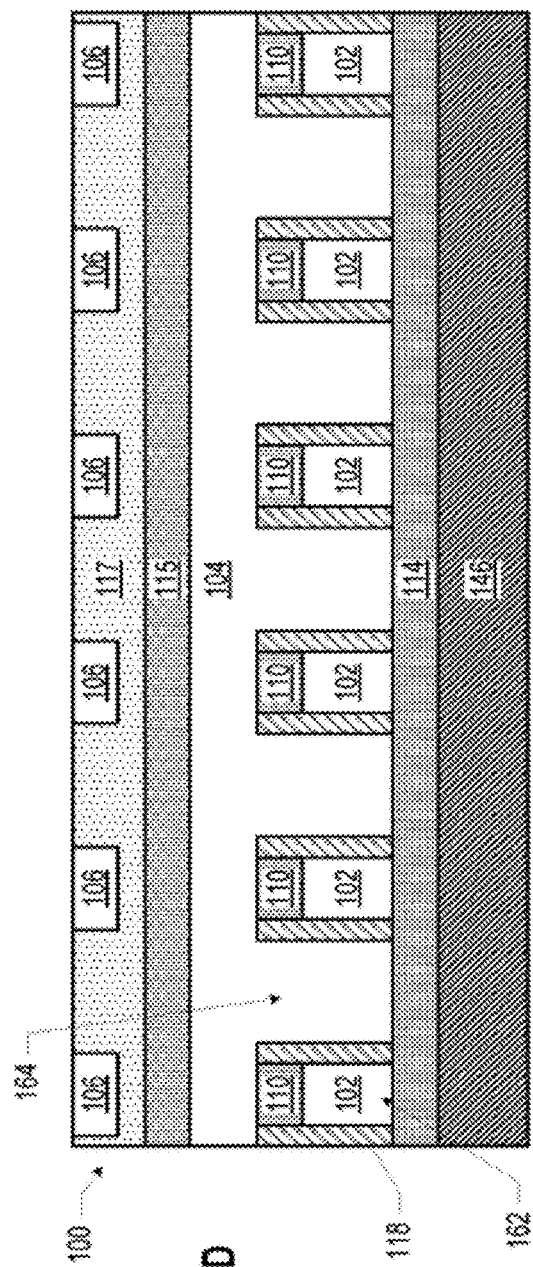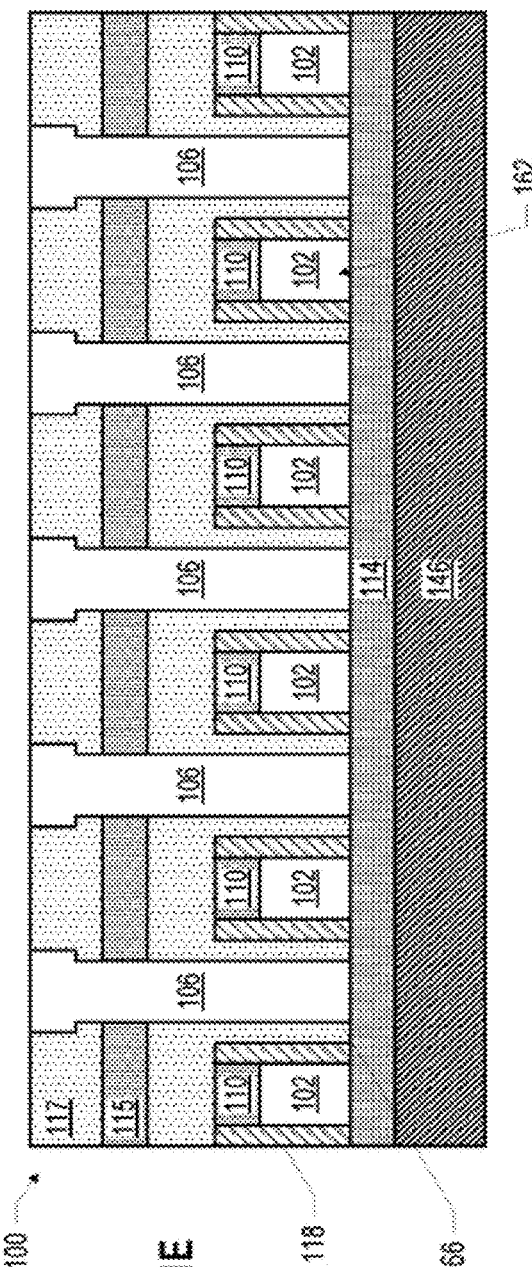
FIG. 1D
FIG. 1E

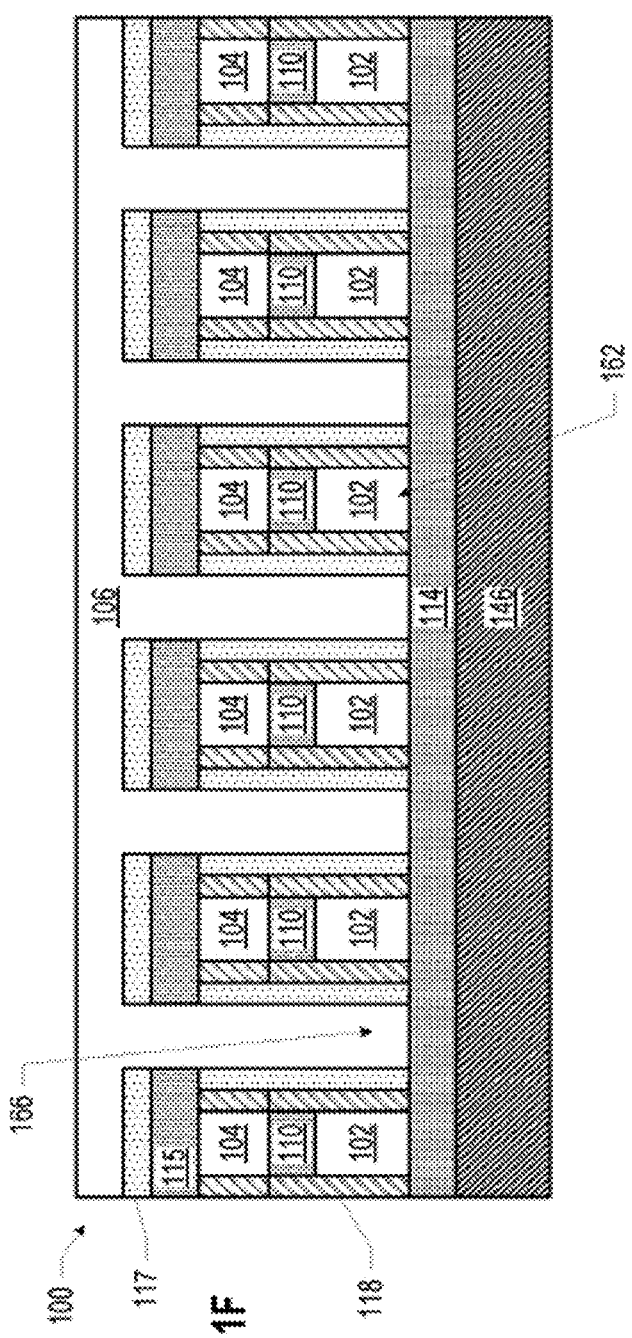

APPARATUS AND METHOD FOR QUANTUM PERFORMANCE AND/OR ERROR CORRECTION ENHANCEMENT USING MULTI-QUBIT GATES

BACKGROUND

Field of the Invention

The embodiments of the invention relate generally to the field of quantum computing. More particularly, these embodiments relate to an apparatus and method for quantum circuit enhancement using multi-qubit gates.

Description of the Related Art

Quantum computing refers to the field of research related to computation systems that use quantum mechanical phenomena to manipulate data. These quantum mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

Current error correction codes generally consist of many gate operations that are repeatedly applied. Implementing these error correction codes requires extensive control circuitry, and the codes take a long time to run compared to the coherence time of the qubits involved. In error correction architectures, it is of high interest to be able to perform error correction cycles on many qubits simultaneously.

BRIEF DESCRIPTION OF THE DRAWINGS

A better understanding of the present invention can be obtained from the following detailed description in conjunction with the following drawings, in which:

FIGS. 1A-1F illustrate various views of an example quantum dot device, in accordance with one embodiment;

DETAILED DESCRIPTION

Figure 1A:
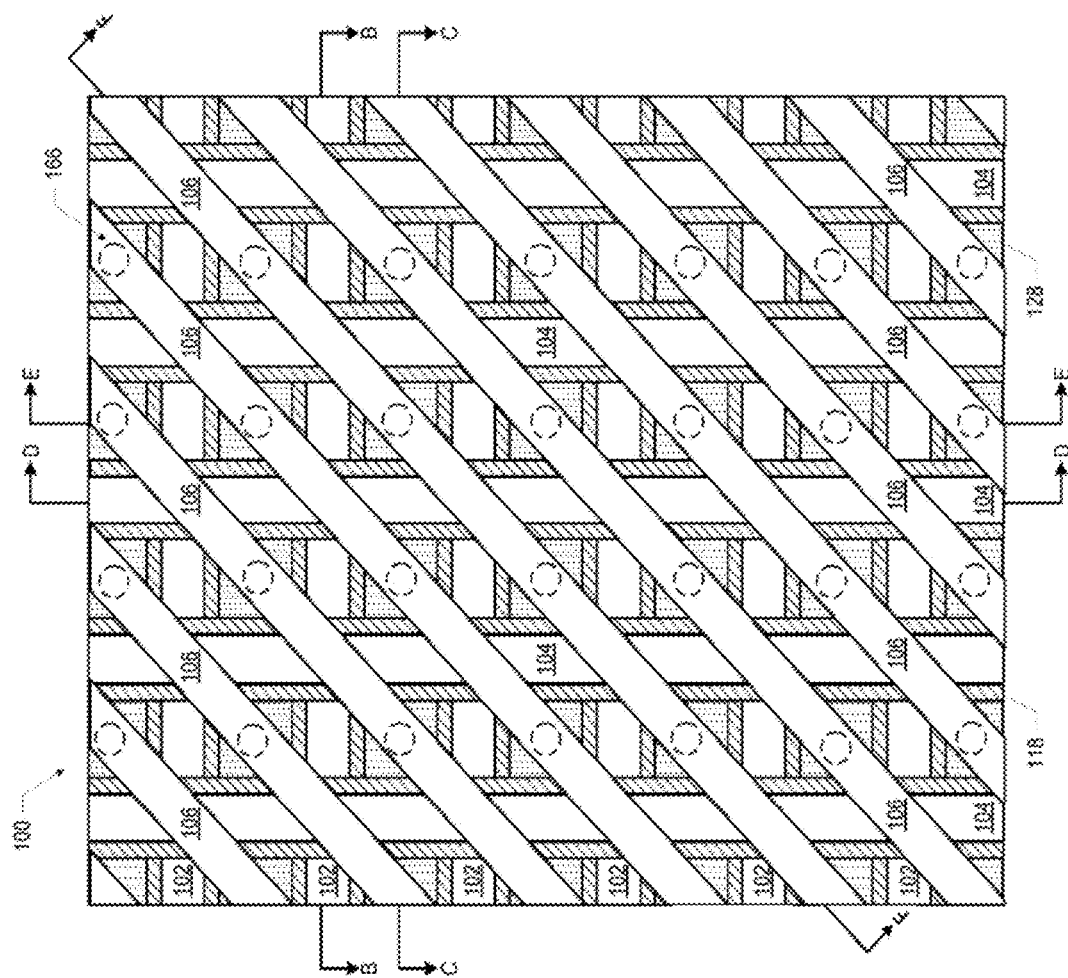

In the following description, for the purposes of explanation, numerous specific details are set forth in order to provide a thorough understanding of the embodiments of the invention described below. It will be apparent, however, to one skilled in the art that the embodiments of the invention may be practiced without some of these specific details. In other instances, well-known structures and devices are shown in block diagram form to avoid obscuring the underlying principles of the embodiments of the invention.

Introduction

A quantum computer uses quantum-mechanical phenomena such as superposition and entanglement to perform computations. In contrast to digital computers which store data in one of two definite states (0 or 1), quantum computation uses quantum bits (qbits), which can be in superpositions of states. Qbits may be implemented using physically distinguishable quantum states of elementary particles such as electrons and photons. For example, the polarization of a photon may be used where the two states are vertical polarization and horizontal polarization. Similarly, the spin of an electron may have distinguishable states such as "up spin" and "down spin."

Qbit states are typically represented by the bracket notations $|0\rangle$ and $|1\rangle$. In a traditional computer system, a bit is exclusively in one state or the other, i.e., a '0' or a '1.' However, qbits in quantum mechanical systems can be in a superposition of both states at the same time, a trait that is unique and fundamental to quantum computing.

Quantum computing systems execute algorithms containing quantum logic operations performed on qubits. The sequence of operations is statically compiled into a schedule and the qubits are addressed using an indexing scheme. This algorithm is then executed a sufficiently large number of times until the confidence interval of the computed answer is above a threshold (e.g., ~95+%). Hitting the threshold means that the desired algorithmic result has been reached.

Qbits have been implemented using a variety of different technologies which are capable of manipulating and reading quantum states. These include, but are not limited to quantum dot devices (spin based and spatial based), trapped-ion devices, superconducting quantum computers, optical lattices, nuclear magnetic resonance computers, solid-state NMR Kane quantum devices, electrons-on-helium quantum computers, cavity quantum electrodynamics (CQED) devices, molecular magnet computers, and fullerene-based ESR quantum computers, to name a few. Thus, while a quantum dot device is described below in relation to certain embodiments of the invention, the underlying principles of the invention may be employed in combination with any type of quantum computer including, but not limited to, those listed above. The particular physical implementation used for qbits is orthogonal to the embodiments of the invention described herein.

Quantum Dot Devices

Quantum dots are small semiconductor particles, typically a few nanometers in size. Because of this small size, quantum dots operate according to the rules of quantum mechanics, having optical and electronic properties which differ from macroscopic entities. Quantum dots are sometimes referred to as "artificial atoms" to connote the fact that a quantum dot is a single object with discrete, bound electronic states, as is the case with atoms or molecules.

Figure 1B:
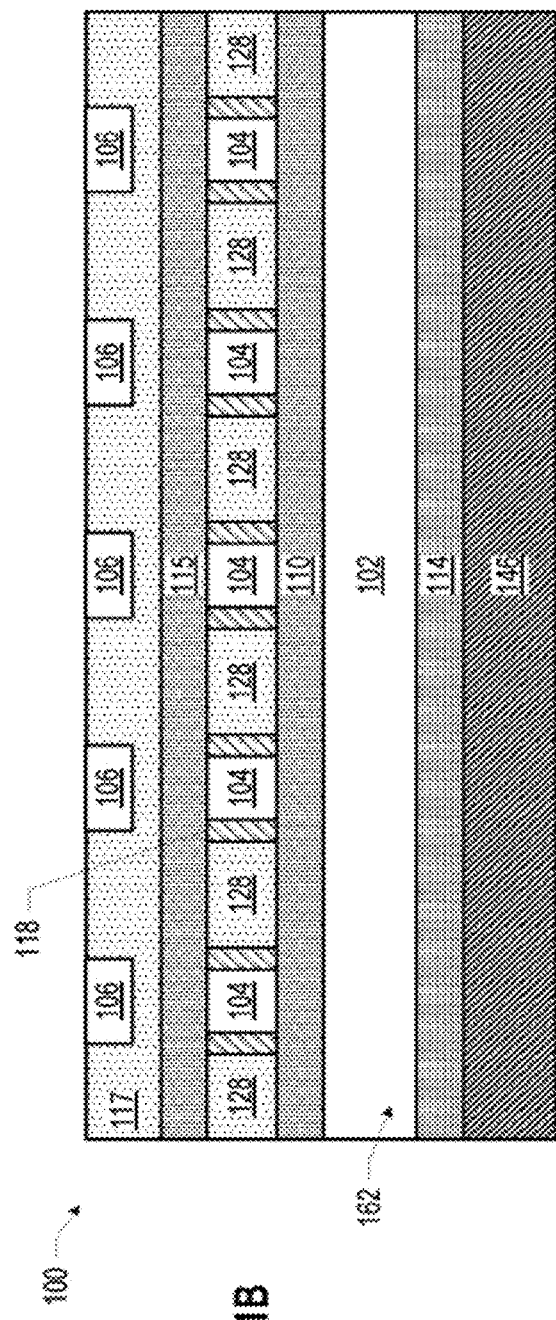
Figure 1C:
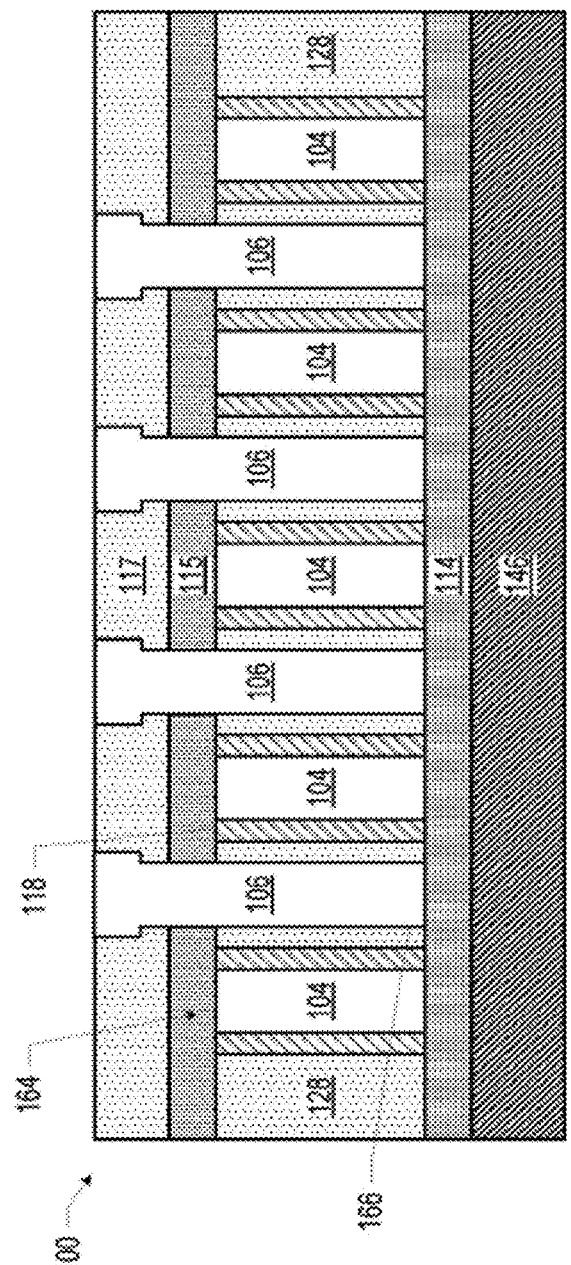

FIGS. 1A-1F are various views of a quantum dot device 100, which may be used with embodiments of the invention described below. FIG. 1A is a top view of a portion of the quantum dot device 100 with some of the materials removed so that the first gate lines 102, the second gate lines 104, and the third gate lines 106 are visible. Although many of the drawings and description herein may refer to a particular set of lines or gates as "barrier" or "quantum dot" lines or gates, respectively, this is simply for ease of discussion, and in other embodiments, the role of "barrier" and "quantum dot" lines and gates may be switched (e.g., barrier gates may instead act as quantum dot gates, and vice versa). FIGS. 1B-1F are side cross-sectional views of the quantum dot device 100 of FIG. 1A; in particular, FIG. 1B is a view through the section B-B of FIG. 1A, FIG. 1C is a view through the section C-C of FIG. 1A, FIG. 1D is a view through the section D-D of FIG. 1A, FIG. 1E is a view through the section E-E of FIG. 1A, and FIG. 1F is a view through the section F-F of FIG. 1A.

The quantum dot device 100 of FIG. 1 may be operated in any of a number of ways. For example, in some embodiments, electrical signals such as voltages, currents, radio frequency (RF), and/or microwave signals, may be provided to one or more first gate line 102, second gate line 104, and/or third gate line 106 to cause a quantum dot (e.g., an electron spin-based quantum dot or a hole spin-based quantum dot) to form in a quantum well stack 146 under a third gate 166 of a third gate line 106. Electrical signals provided to a third gate line 106 may control the electrical potential of a quantum well under the third gates 166 of that third gate line 106, while electrical signals provided to a first gate line 102 (and/or a second gate line 104) may control the potential energy barrier under the first gates 162 of that first gate line 102 (and/or the second gates 164 of that second gate line 104) between adjacent quantum wells. Quantum interactions between quantum dots in different quantum wells in the quantum well stack 146 (e.g., under different quantum dot gates) may be controlled in part by the potential energy barrier provided by the barrier potentials imposed between them (e.g., by intervening barrier gates).

Generally, the quantum dot devices 100 disclosed herein may further include a source of magnetic fields (not shown) that may be used to create an energy difference in the states of a quantum dot (e.g., the spin states of an electron spin-based quantum dot) that are normally degenerate, and the states of the quantum dots (e.g., the spin states) may be manipulated by applying electromagnetic energy to the gates lines to create quantum bits capable of computation. The source of magnetic fields may be one or more magnet lines, as discussed below. Thus, the quantum dot devices 100 disclosed herein may, through controlled application of electromagnetic energy, be able to manipulate the position, number, and quantum state (e.g., spin) of quantum dots in the quantum well stack 146.

In the quantum dot device 100 of FIG. 1, a gate dielectric 114 may be disposed on a quantum well stack 146. A quantum well stack 146 may include at least one quantum well layer 152 (not shown in FIG. 1) in which quantum dots may be localized during operation of the quantum dot device 100. The gate dielectric 114 may be any suitable material, such as a high-k material. Multiple parallel first gate lines 102 may be disposed on the gate dielectric 114, and spacer material 118 may be disposed on side faces of the first gate lines 102. In some embodiments, a patterned hardmask 110 may be disposed on the first gate lines 102 (with the pattern corresponding to the pattern of the first gate lines 102), and the spacer material 118 may extend up the sides of the hardmask 110, as shown. The first gate lines 102 may each be a first gate 162. Different ones of the first gate lines 102 may be electrically controlled in any desired combination (e.g., each first gate line 102 may be separately electrically controlled, or some or all the first gate lines 102 may be shorted together in one or more groups, as desired).

Multiple parallel second gate lines 104 may be disposed over and between the first gate lines 102. As illustrated in FIG. 1, the second gate lines 104 may be arranged perpendicular to the first gate lines 102. The second gate lines 104 may extend over the hardmask 110, and may include second gates 164 that extend down toward the quantum well stack 146 and contact the gate dielectric 114 between adjacent ones of the first gate lines 102, as illustrated in FIG. 1D. In some embodiments, the second gates 164 may fill the area between adjacent ones of the first gate lines 102/spacer material 118 structures; in other embodiments, an insulating material (not shown) may be present between the first gate lines 102/spacer material 118 structures and the proximate second gates 164. In some embodiments, spacer material 118 may be disposed on side faces of the second gate lines 104; in other embodiments, no spacer material 118 may be disposed on side faces of the second gate lines 104. In some embodiments, a hardmask 115 may be disposed above the second gate lines 104. Multiple ones of the second gates 164 of a second gate line 104 are electrically continuous (due to the shared conductive material of the second gate line 104 over the hardmask 110). Different ones of the second gate lines 104 may be electrically controlled in any desired combination (e.g., each second gate line 104 may be separately electrically controlled, or some or all the second gate lines 104 may be shorted together in one or more groups, as desired). Together, the first gate lines 102 and the second gate lines 104 may form a grid, as depicted in FIG. 1.

Multiple parallel third gate lines 106 may be disposed over and between the first gate lines 102 and the second gate lines 104. As illustrated in FIG. 1, the third gate lines 106 may be arranged diagonal to the first gate lines 102, and diagonal to the second gate lines 104. In particular, the third gate lines 106 may be arranged diagonally over the openings in the grid formed by the first gate lines 102 and the second gate lines 104. The third gate lines 106 may include third gates 166 that extend down to the gate dielectric 114 in the openings in the grid formed by the first gate lines 102 and the second gate lines 104; thus, each third gate 166 may be bordered by two different first gate lines 102 and two different second gate lines 104. In some embodiments, the third gates 166 may be bordered by insulating material 128; in other embodiments, the third gates 166 may fill the openings in the grid (e.g., contacting the spacer material 118 disposed on side faces of the adjacent first gate lines 102 and the second gate lines 104, not shown). Additional insulating material 117 may be disposed on and/or around the third gate lines 106. Multiple ones of the third gates 166 of a third gate line 106 are electrically continuous (due to the shared conductive material of the third gate line 106 over the first gate lines 102 and the second gate lines 104). Different ones of the third gate lines 106 may be electrically controlled in any desired combination (e.g., each third gate line 106 may be separately electrically controlled, or some or all the third gate lines 106 may be shorted together in one or more groups, as desired).

Although FIGS. 1A-F illustrate a particular number of first gate lines 102, second gate lines 104, and third gate lines 106, this is simply for illustrative purposes, and any number of first gate lines 102, second gate lines 104, and third gate lines 106 may be included in a quantum dot device 100. Other examples of arrangements of first gate lines 102, second gate lines 104, and third gate lines 106 are possible. Electrical interconnects (e.g., vias and conductive lines) may contact the first gate lines 102, second gate lines 104, and third gate lines 106 in any desired manner.

Not illustrated in FIG. 1 are accumulation regions that may be electrically coupled to the quantum well layer of the quantum well stack 146 (e.g., laterally proximate to the quantum well layer). The accumulation regions may be spaced apart from the gate lines by a thin layer of an intervening dielectric material. The accumulation regions may be regions in which carriers accumulate (e.g., due to doping, or due to the presence of large electrodes that pull carriers into the quantum well layer), and may serve as reservoirs of carriers that can be selectively drawn into the areas of the quantum well layer under the third gates 166 (e.g., by controlling the voltages on the quantum dot gates, the first gates 162, and the second gates 164) to form carrier-based quantum dots (e.g., electron or hole quantum dots, including a single charge carrier, multiple charge carriers, or no charge carriers). In other embodiments, a quantum dot device 100 may not include lateral accumulation regions, but may instead include doped layers within the quantum well stack 146. These doped layers may provide the carriers to the quantum well layer. Any combination of accumulation regions (e.g., doped or non-doped) or doped layers in a quantum well stack 146 may be used in any of the embodiments of the quantum dot devices 100 disclosed herein.

Apparatus and Method for a Hybrid Classical Quantum Computer

After Richard Feynman asked in 1982 whether quantum physics could be simulated efficiently using a quantum computer, much effort researching for a quantum computer has been focused on its universality and its efficiency over classical computation. One such example is David Deutsch's quantum Turing machine in 1985 that can be programmed to perform any computational task that can be performed by any physical object.

In contrast to theories and algorithms, quantum physical machines are in still their infancy. Efforts to build quantum information processing systems have resulted in modest success to date. Small quantum computers, capable of performing a small set of quantum operations on a very few qubits, represent the state of the art in quantum computation. In addition, quantum states are fragile in the sense that quantum states only remain coherent for a limited duration. This gap between algorithms and physical machines has driven the effort to invent hybrid classical-quantum algorithms. Some recent quantum algorithm developments have focused on short-depth quantum circuits to carry out quantum computations formed as subroutines embedded in a larger classical optimization loop, such as the variational eigensolver (P. J. J. O'Malley, 2016). Quantum languages, tools, and flows have been developed, providing software layers/stacks to translate and optimize applications to the quantum physical layer to cope with the stringent resource constraints in quantum computing (Frederic T. Chong, 2017, 14 Sep.).

On the hardware side, classical computers have been used to perform error correction for quantum computations. The "quantum co-processor" model is the most favorable prevailing execution model where a classical CPU controls a quantum processing unit in a similar manner to how CPUs in modern computer systems interact with GPUs. As described in (X. Fu, 2016, May) and (X. Fu, 2018), the microarchitecture for experimental superconducting quantum co-processors included features such as an arbiter on the code fetch data path to steer classical instruction to host CPU and quantum instruction to quantum co-processor, an exchange register file to synchronize register files between host CPU and the quantum co-processor, and a quantum instruction cache.

The microarchitectures for these mechanisms, however, are not well defined and explicit support for hybrid classical-quantum programs is lacking. Consequently, it is unclear how a quantum co-processor would be implemented within a quantum computer, particularly one which is required to run a diverse set of quantum programs. A flexible and programmable model has yet to be developed for executing hybrid classical-quantum algorithms.

One embodiment of the invention adds a set of quantum instructions to an instruction set architecture (ISA) of a processor such as a CPU. By way of example, these instructions may be included in an extension to the ISA (e.g., such as the AVX-512 extensions for the x86 platform). In addition, in one embodiment, a quantum engine is added to the processor's execution unit and the new quantum instructions are fetched, decoded, scheduled, and executed on the functional units of the quantum engine. In one embodiment, the quantum engine interacts with the classical execution engines using a shared register file and/or system memory. Upon executing the quantum instructions (or quantum cops in certain embodiments described herein), the quantum execution engine generates control signals to manipulate the state of the qubits within the quantum processor. The quantum engine also executes instructions to take a measurement of specified sets of qubits and store the results. In these embodiments, a quantum/classical interface provides connectivity between the quantum engine of the classical processor and the quantum processor.

Figure 2:
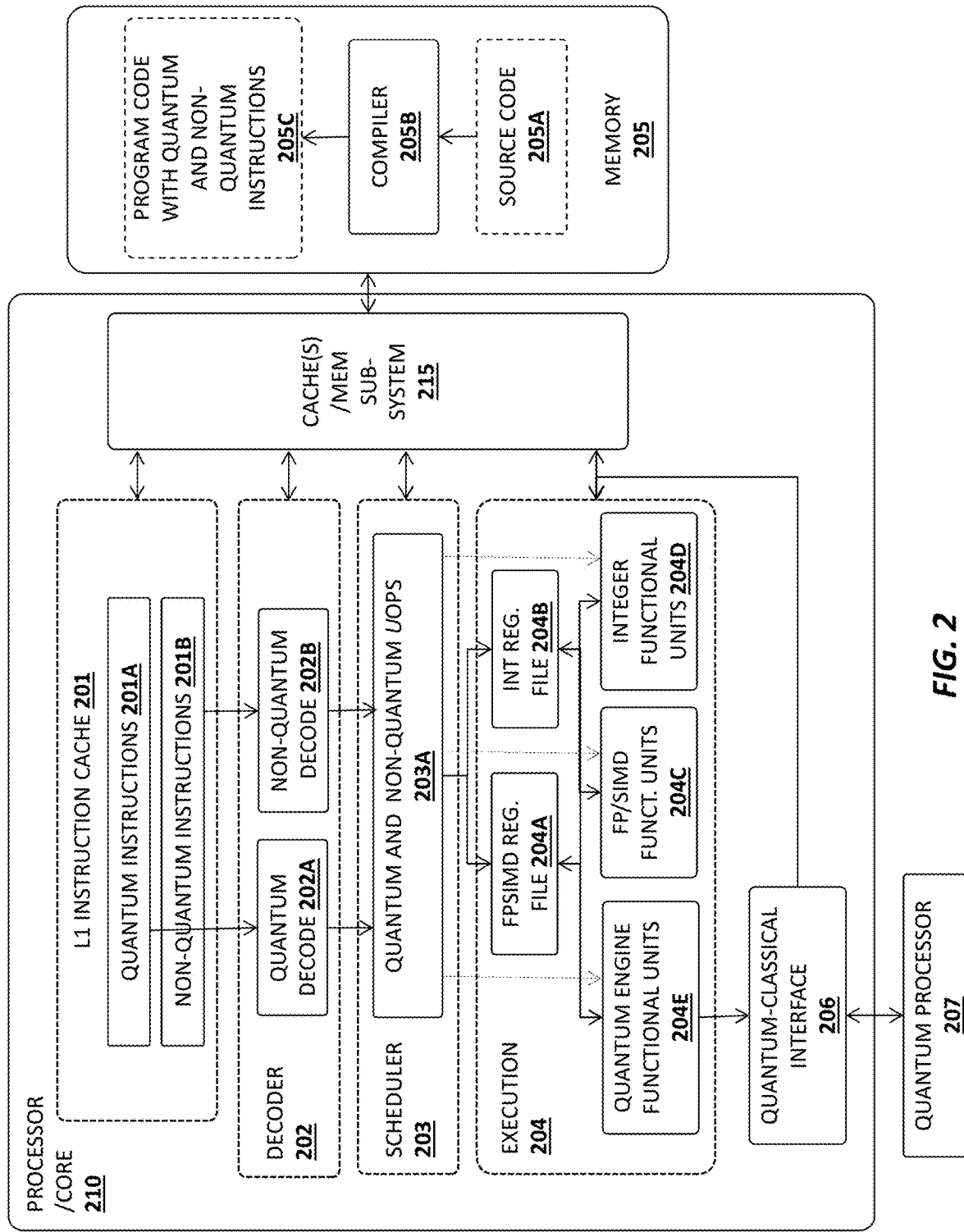
FIG. 2 illustrates one embodiment of a processor pipeline for processing quantum and non-quantum instructions.

FIG. 2 illustrates one embodiment of a processor or core 210 which fetches, decodes, and executes quantum instructions 201A and non-quantum instructions 201B, utilizing the same pipeline resources as the non-quantum instructions 201B. The processor/core 210 of this embodiment supports quantum extensions to an existing ISA of the processor/core 210 (e.g., extending the ISA to include the quantum instructions 201A). Program code 205C comprising the quantum and non-quantum instructions is generated by a compiler 205B from source code 205A written by a programmer (e.g., utilizing the extended ISA). Various source/program code examples are provided below.

Quantum and non-quantum instructions 201A-B are fetched from memory 205 at the front end of the instruction pipeline and stored in a Level 1 (L1) instruction cache 201.

Instructions and data may also be stored within a Level 2 or Level 3 cache within a cache/memory subsystem 215, which manages memory requests and cache coherency.

A decoder 202 decodes the instructions 201A-B into micro-operations or uops 203A which are scheduled for execution by a scheduler 203 and executed by execution circuitry 204. In one embodiment, certain stages of the pipeline are enhanced to include hardware support for processing the quantum instructions 201B while other stages are unaltered. For example, quantum decode circuitry 202A may be added to the decoder 202 for decoding the quantum instructions 201A, just as non-quantum decode circuitry 202B decodes non-quantum instructions 201B. Although illustrated as separate components in FIG. 2 for the purpose of explanation, the quantum decode circuitry 202A and non-quantum decode circuitry 202B may comprise a common or overlapping set of circuitry and/or microcode. For example, in one embodiment, an existing decoder may be extended to include microcode support for quantum instructions (e.g., in microcode ROM) to generate new sets of quantum uops. The decoder 202 includes other decode circuitry such as a set of decode table structures (see, e.g., FIG. 3 and associated text), depending on the processor architecture.

In one embodiment, the decoder 202 generates a sequence of uops 203A in response to decoding the instructions 201A-B. In an implementation with quantum and non-quantum instructions, the uops may include a mixture of quantum uops and non-quantum uops, which are then scheduled for execution by an instruction scheduler 203.

The quantum and non-quantum uops 203A generated by the decoder 202 may initially be queued for execution within one or more uop queues of the scheduler 203, which dispatches the uops from the uop queue(s) in accordance with dependencies and/or execution resource availability. The embodiments of the invention may be implemented on various different types of processors with different types of schedulers. For example, in one embodiment, a set of execution "ports" couple the scheduler 203 to the execution circuitry 204, where each execution port is capable of issuing uops to a particular set of functional units 204C-E. In the example architecture shown in FIG. 2, for example, SIMD and floating point (FP) uops may be issued by the scheduler 203 over a FP/SIMD execution port coupled to a set of FP/SIMD functional units 204C and integer uops may be issued over an integer port coupled to a set of integer functional units 204D. While only two types of non-quantum functional units are shown for simplicity, the processor/core 210 may include various other/additional non-quantum functional units (e.g., such as load/store address generation units, branch units, additional SIMD and integer units, etc).

In the particular embodiment shown in FIG. 2, the quantum engine functional units 204E share the same set of register files 204A-B used by the legacy processor functional units 204C-D. In this particular example, the register files 204A-B include a FP/SIMD register file 204A which stores floating point and SIMD operands used by the FP/SIMD functional units 204C and an integer register file 204B which stores integer operands for the integer functional units 204D. In one implementation, the FP/SIMD register file 204A comprises 512 bit vector registers and the integer register file 204B comprises 64-bit scalar registers. Of course, different processor architectures will use different types of registers shared by the quantum engine functional units 204E. Various other types of registers may also be used such as a set of control/status registers and mask registers.

In an embodiment in which quantum uops are mixed with non-quantum uops, the quantum uops are issued over one or more quantum ports to a set of quantum engine functional units 204E, which execute the quantum uops to perform the underlying quantum operations. For example, the quantum engine functional units 204E, in response to the quantum uops, may generate control signals over a quantum-classical interface 206 to manipulate and take measurements of the qubits of a quantum processor 207.

The quantum-classical interface 206 includes digital-to-analog (D-A) circuitry to convert the digital quantum control signals generated by the quantum engine functional units 204E to analog signals required to control the quantum processor 207 (e.g., such as the codeword triggered pulse generation (CTPG) units and Arbitrary Waveform Generator (AWG) described below) and also includes analog-to-digital (A-D) circuitry to convert the physical qubit measurements to digital result data.

In one embodiment, the quantum-classical interface 206 is integrated on the same semiconductor chip as the other components of the instruction processing pipeline (e.g., the execution circuitry 204, scheduler 203, decoder 202, etc). As discussed in detail below, different types of circuit/logic components may be used depending on the particular physical implementation of the quantum processor 207.

Figure 3:
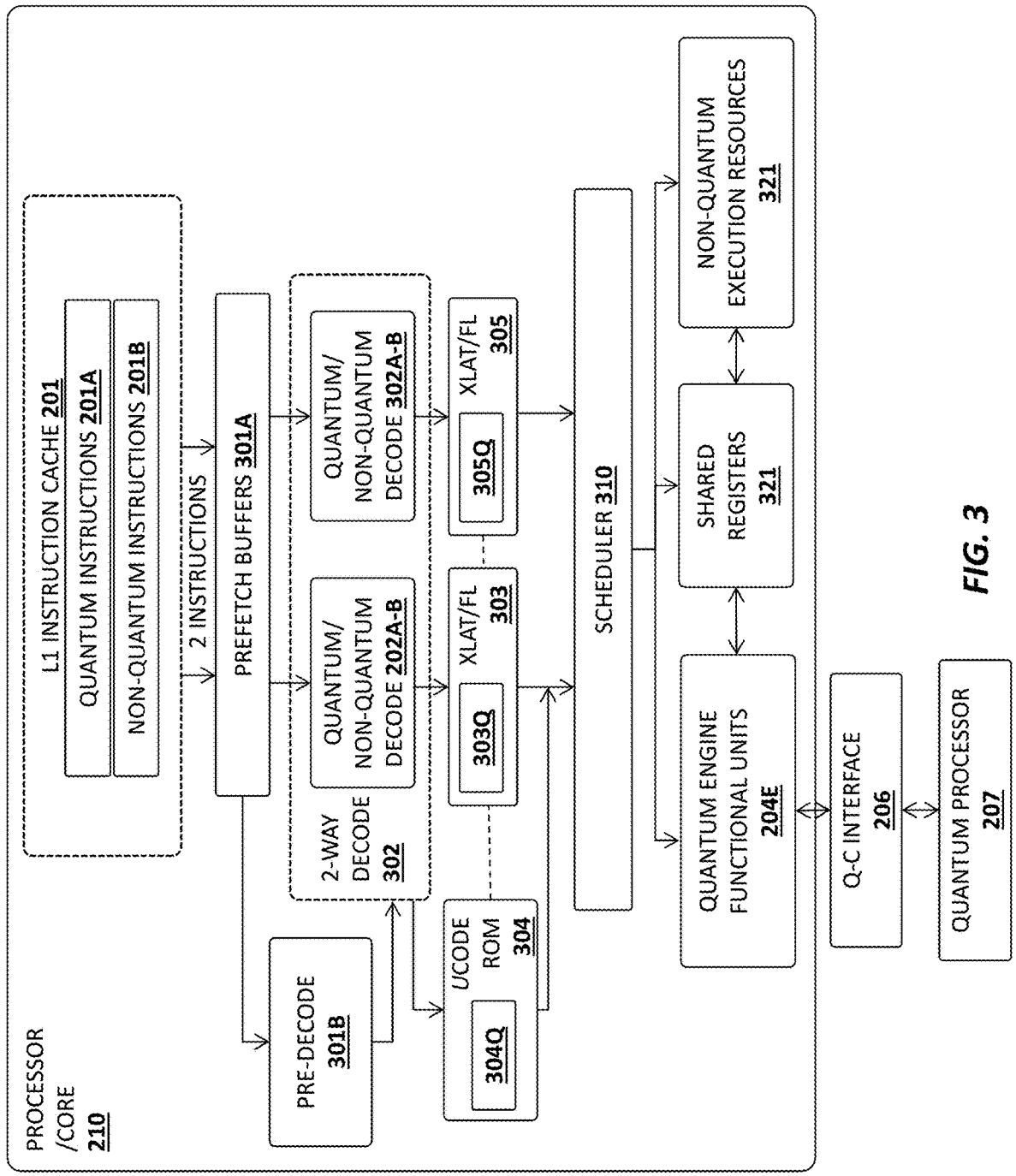
FIG. 3 illustrates an embodiment of front-end circuitry of a processor for processing quantum and non-quantum instructions.

FIG. 3 illustrates one embodiment in which quantum instruction processing support is added to a low power processing pipeline including a pre-decode buffer 301B, a 2-way decoder 302 with dual sets of quantum/non-quantum decoder circuitry 202A-B, 302A-B, dual lookup tables for instruction translation (XLAT), and a ucode ROM 304. In one embodiment, the XLAT components 303, 305 and ucode ROM 304 are extended to support the quantum instructions, as indicated by logic blocks 303Q-305Q. The pre-decode buffer 301B detects and marks macro-instruction boundaries prior to full decoding into uops by the 2-way decoder 302.

The operands for the quantum and non-quantum uops are stored in a set of shared registers 321 (as described above) and accessed by the quantum functional units 320 when executing the uops. The Q-C interface 320, in response to the quantum uops, controls the operation of the quantum processor 207.

Figure 4A:
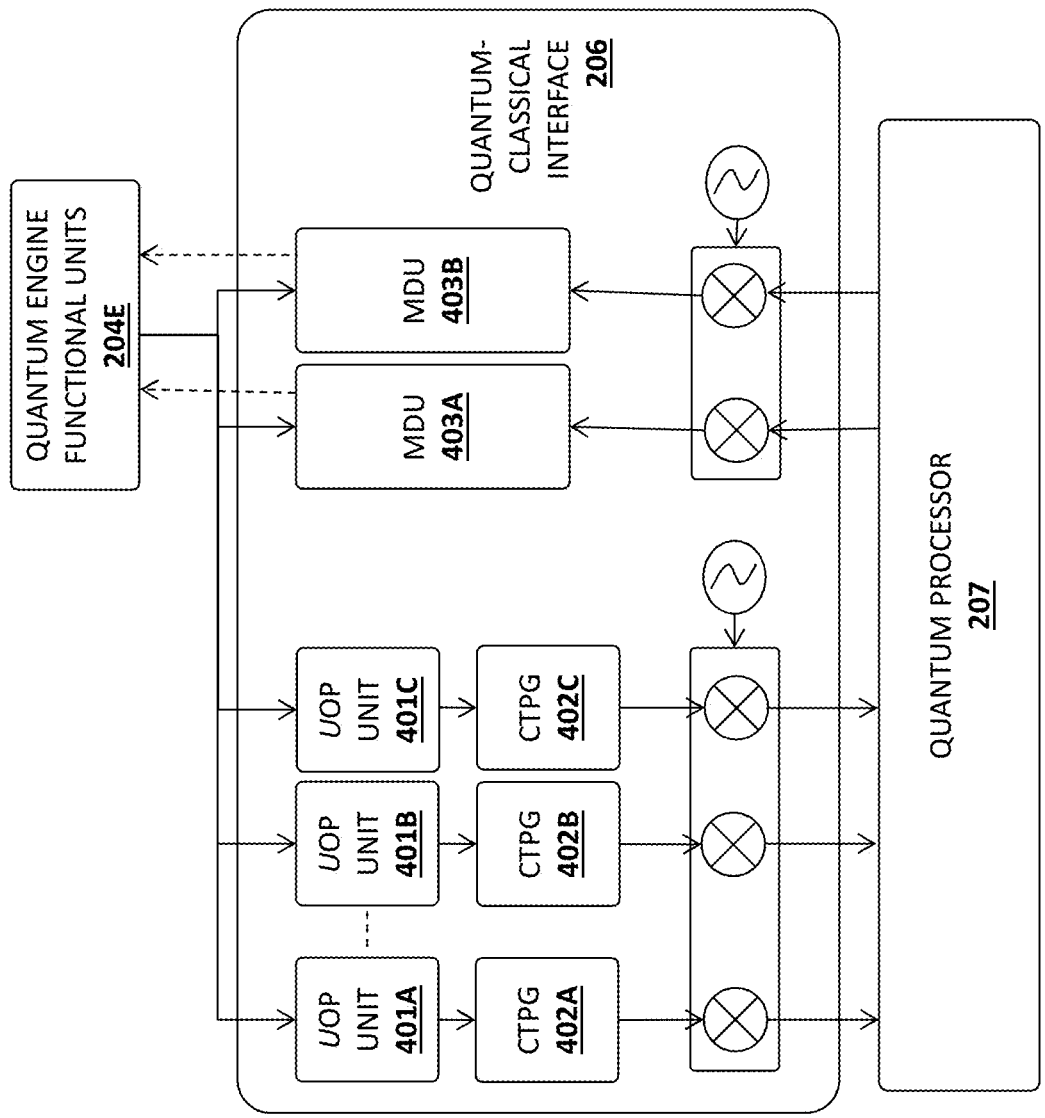
FIGS. 4A-B illustrate embodiments of a quantum-classical processor interface.
Figure 4B:
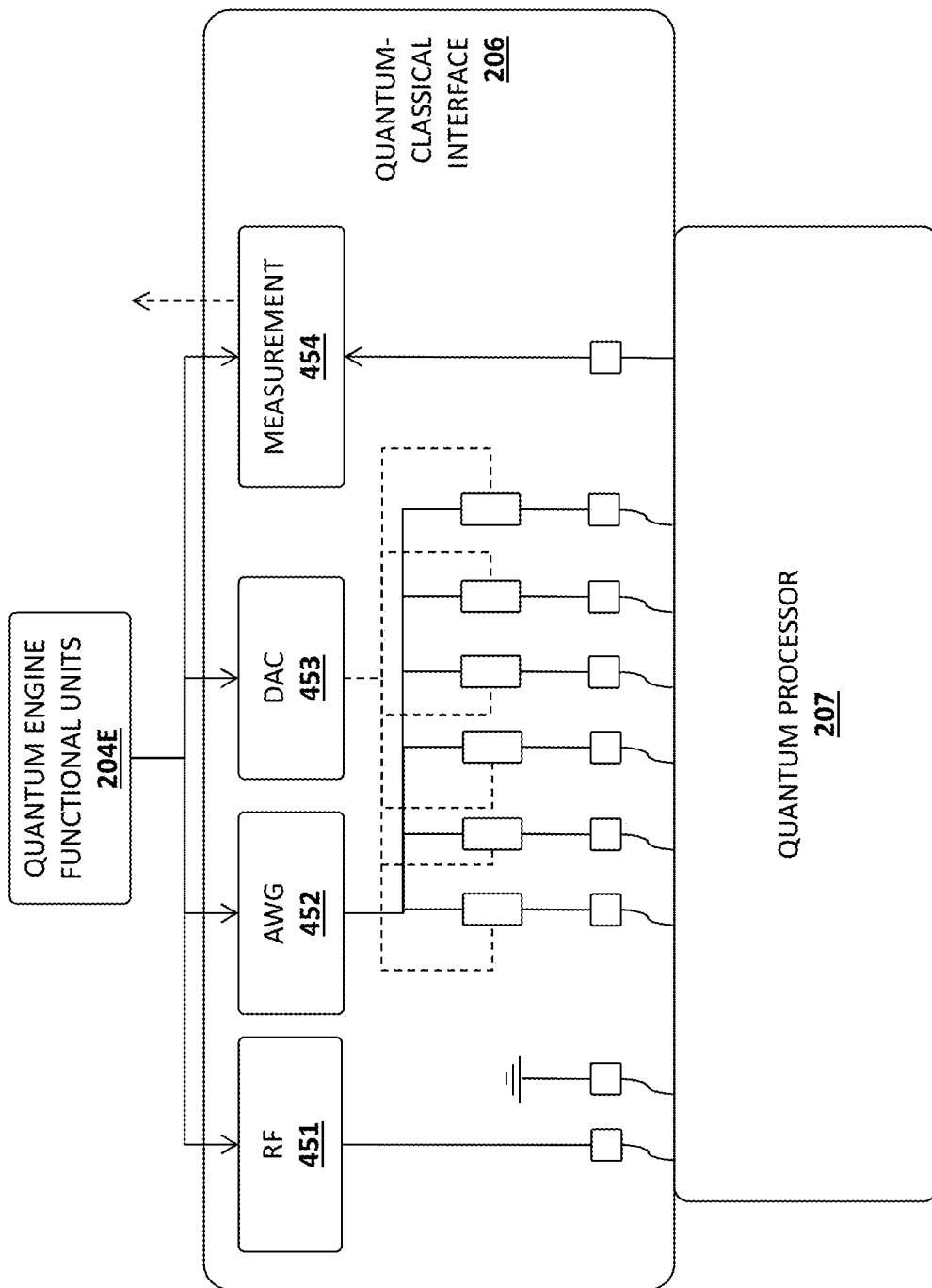

Different examples of a quantum-classical interface 206 are illustrated in FIGS. 4A-B. The Q-C interface 206 in FIG. 4A includes a plurality of uop units 401A-C which, responsive to the uops executed by the quantum engine functional units 204E, generate codewords to control operation of a plurality of codeword triggered pulse generation (CTPG) units 402A-C. In response, the CTPG units 402A-C generate sequences of pulses to control the qubits of the quantum processor 207. Once the quantum processor 207 has reached a specified execution state, quantum measurements are taken by one or more of the measurement discrimination units (MDUs) 403A-B.

The Q-C interface 206 shown in FIG. 4B includes a set of components to perform microwave complex signal generation including an RF microwave unit 451, a multi-channel Arbitrary Waveform Generators (AWG) 452, one or more digital to analog converters (DACs) 453 and one or more measurement units 454. In one embodiment, the input to each of these components comprises a set of codewords generated by the quantum engine functional units 204E and the output is an analog waveform which manipulates the state of the qubits of the quantum processor 207. The measurement units 454 measure a current state associated with one or more qubits at a designated point in execution.

Apparatus and Method for Quantum Performance and Error Correction Enhancements Using Multi-Qubit Gates Quantum circuits are often composed of one-qubit and two-qubit gates which are sequentially implemented on physical qubits. Because these gates are executed serially, they may require timescales that extend past the qubit coherence time. By way of a specific example, current error correction codes generally consist of many gate operations that are repeatedly applied and may therefore extend past the coherence time of the qubits involved.

One embodiment of the invention comprises a set of multi-qubit gates that realize the same circuit functions and error-correcting capabilities (or similar capabilities, with a specified threshold) of a source quantum circuit and/or arbitrary error correction code. For example, one embodiment analyzes an original quantum circuit to identify sub-circuits which are replaced with multi-qubit gates. With respect to error correction, one embodiment comprises a gate generator which analyzes an arbitrary error-correction code and generates a multi-qubit gate design which implements or supplements error correction in a quantum system.

Figure 5:
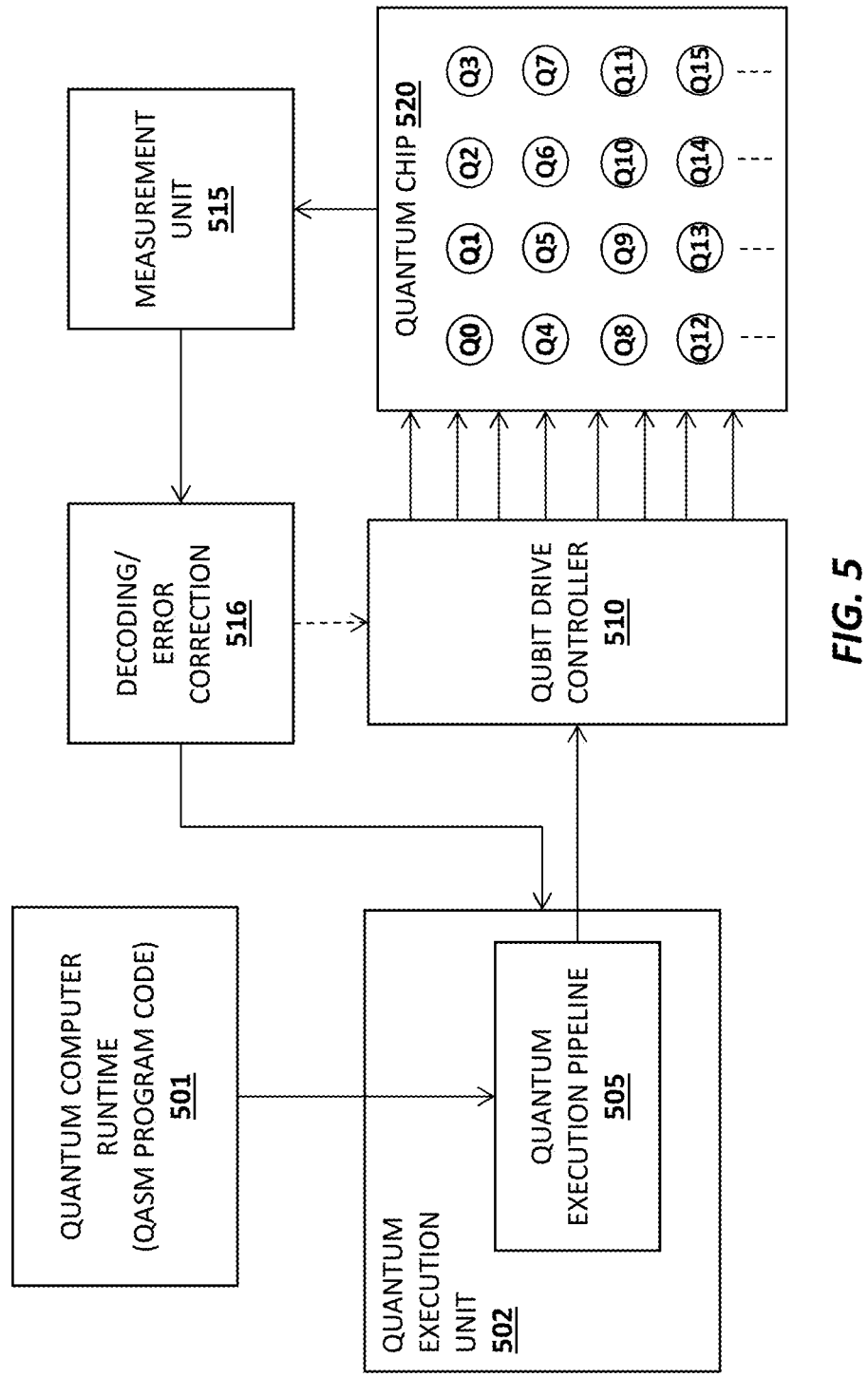
FIG. 5 illustrates an example of a quantum computing system.

For the purpose of comparison, FIG. 5 illustrates a typical quantum computer execution flow. The illustrated example includes a quantum computer runtime 501 (e.g., implemented in QASM program code), which is executed by a quantum execution pipeline 505 of a quantum execution unit 502. The quantum execution unit 502 may be an application-specific integrated circuit ASIC or may be a programmable functional unit for executing quantum instructions.

In response to execution of the quantum program code, the quantum execution pipeline 505 transmits commands to a qubit drive controller 510 which performs the physical quantum operations on the quantum chip 520. Depending on the implementation, this may be accomplished by a sequence of RF pulses to manipulate the qubits Q0-Q15 of the quantum chip 520.

For instance, in general surface code error correction, measurement unit 515 reads/estimates the quantum state of one or more of the qubits Q0-Q15 and provides the measurement results to a decoding/error correction unit 516 which decodes the measurements using error correction decoding techniques. For example, the decoding/error correction unit 516 decodes a multi-qubit measurement from the quantum processor 520 to determine whether an error has occurred and, if so, implements corrective measures if possible. The error measurements may be taken from multiple qubits in a manner which does not disturb the quantum information in the encoded state of the qubits (e.g., using ancilla qubits). In response, error syndrome data may be generated from which errors and corrective operations may be identified. In one embodiment, the error syndrome data comprises a stabilizer code such as a surface code. In some cases, the response may simply be to reinitialize the qbits Q0-Q15 and start over. In other cases, however, modifications to the quantum algorithm may be implemented in the quantum program code 501. However, there can be other error correction code implementations that do not require measurement, and the corrective action happens as the algorithm runs on the qubit chip.

The decoded/corrected results are provided to the quantum execution unit 502 for further processing in accordance with the quantum runtime 501. The typical operational flow of current quantum computer designs based on a fixed cycle time for each quantum operation executed by the quantum execution pipeline 505 and each measurement taken by the measurement unit 515.

Figure 6:
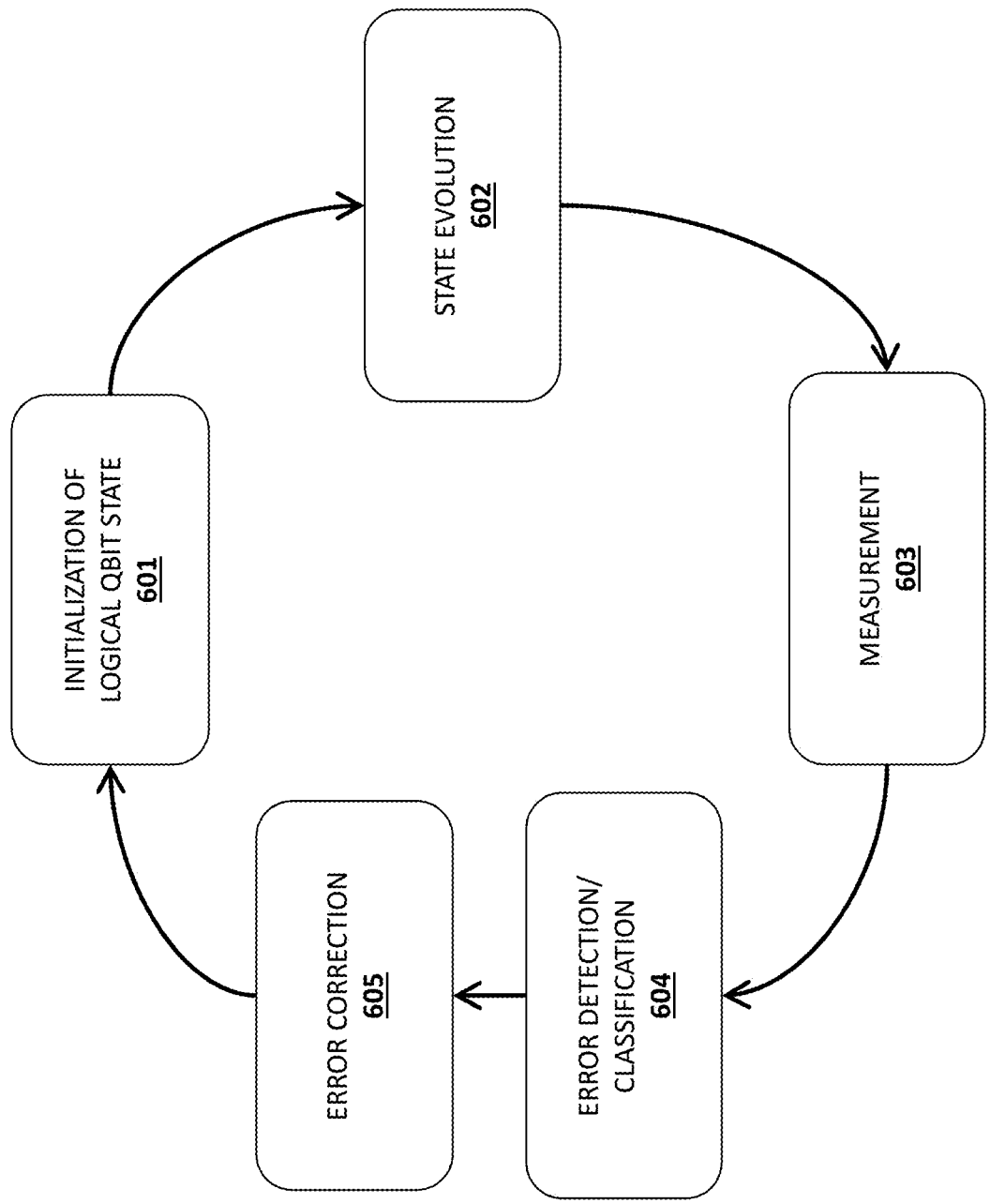
FIG. 6 illustrates one embodiment of a quantum error correction sequence.

FIG. 6 illustrates one embodiment of a quantum error correction cycle which may be implemented by the architectures described herein. At 601 the logical qbit state of the system is initialized. For example, if electron spin is used as the quantum state, then electrons within the quantum system may be prepared (e.g., initialized to a particular spin orientation and/or entangled using electromagnetic control signals from the quantum controller).

At 602, the state of the quantum system evolves in response to additional electromagnetic inputs specified by the quantum runtime 201 and implemented by the quantum controller 205. For example, different sets of qubits, including ancilla qubits, may be entangled and manipulated in accordance with the quantum runtime 201.

At 603, a measurement of the quantum system is taken. For example, the current spin of one of the entangled electrons may be measured. The system may subsequently be re-initialized prior to the next measurement (i.e., given that taking a measurement or learning any information about the quantum system disrupts the quantum state). The physical qubits may be periodically measured during each error correction cycle. At 604 error detection/classification is performed on the measured results to determine whether an error has occurred (e.g., a random flip of a qubit). The error cycle completes with an error correction operation at 605, which attempts to correct any detected errors.

In one embodiment, an original quantum circuit is evaluated to determine whether the time required for algorithm execution can be reduced, including the time required for error correction. Multiple gates are combined and multi-qubit gates are formed to generate a new quantum implementation which has the same functionality as the original quantum circuit but more efficiently and (in some embodiments) with integrated error correction.

While certain embodiments described herein focus specifically on error correction, the underlying principles of the invention described herein may be applied more generally to any original quantum circuit to reduce the algorithm execution time by replacing one or more quantum sub-circuits of the original quantum circuit with multi-qubit gates.

Figure 7:
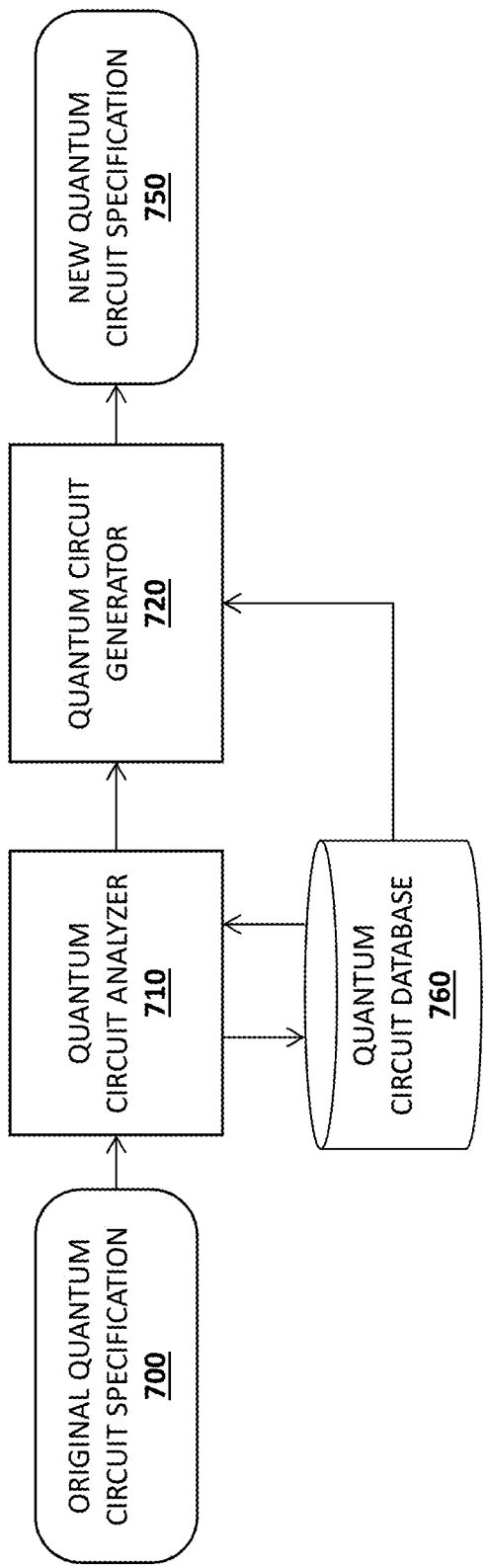
FIG. 7 illustrates one embodiment of the invention in which an original quantum circuit specification is analyzed and improved using multi-qubit gates.

FIG. 7 illustrates one embodiment of the invention in which a quantum circuit analyzer 710 evaluates an original quantum circuit specification 700, potentially in view of a given error correction code, to determine alternate configurations in which certain sub-circuits are replaced with multi-qubit gates which implement the same functionality of the sub-circuits and (in one embodiment) perform the desired error correction code 715. The quantum circuit analyzer 710 and other components in FIG. 7 may be implemented in software, circuitry, or any combination thereof. For example, in one implementation, the quantum circuit analyzer 710 is implemented as a component within a quantum simulation application. In this implementation, the circuitry may comprise a general purpose processor for executing program code stored in memory to implement the quantum circuit analyzer 710 and other illustrated components. In another embodiment, one or more of the components illustrated in FIG. 7 may be implemented in application-specific and/or fixed function hardware such as an ASIC.

In one implementation, a quantum circuit database 760 is maintained in which different quantum circuits/sub-circuits are associated with different multi-qubit gate arrangements. In operation, when the quantum circuit analyzer 710 identifies a particular circuit/sub-circuit, it queries the quantum circuit database 760 to determine whether one or more replacement multi-qubit gate circuits exist (e.g., which would reduce the execution time). If only one multi-qubit gate circuit exists, then the quantum circuit analyzer selects this multi-qubit gate circuit as a replacement for the circuit/sub-circuit in the original quantum circuit specification 700. In one embodiment, if multiple multi-qubit circuits exist, then the quantum circuit analyzer 710 may perform further analysis to select one of the multi-qubit circuits. For example, the quantum circuit analyzer 710 may factor in the complexity, reliability, efficiency, or other variables associated with the different multi-qubit gate circuits and/or variables associated with the existing physical qubits on the physical quantum chip 520 to render a selection. Once selected, the quantum circuit analyzer 710 identifies the multi-qubit gate circuit to the quantum circuit generator 720.

Using the results of the quantum circuit analyzer's 710's evaluation of the original quantum circuit specification 700 (e.g., an indication of replacement multi-qubit gates), a quantum circuit generator 720 generates a new quantum circuit specification 750 in which the one or more sub-circuits are replaced by the multi-qubit gates identified by the quantum circuit analyzer 710.

Figure 8:
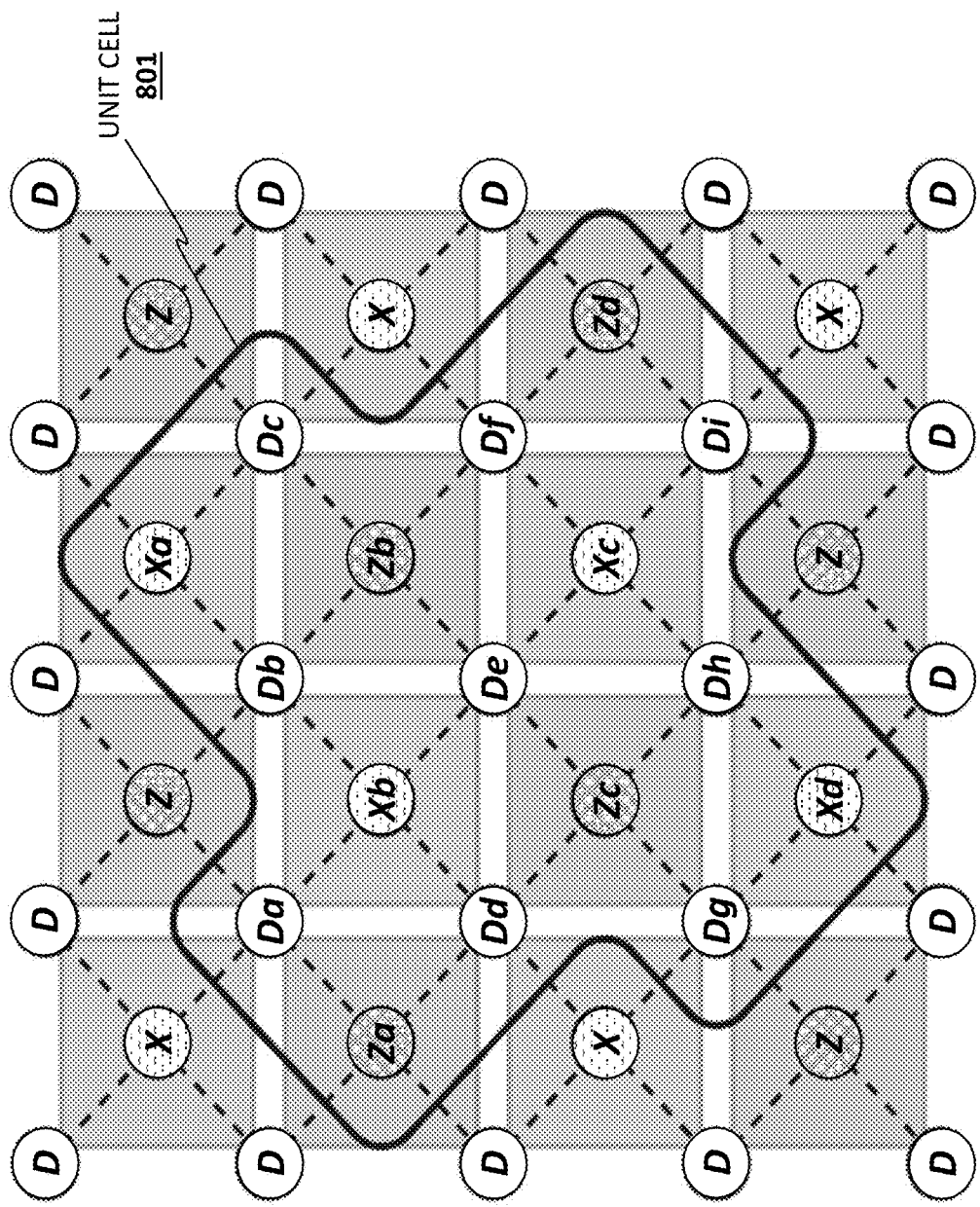
FIG. 8 illustrates an example of a unit cell comprising a plurality of data qubits and a plurality of ancilla or control qubits.

A specific example is provided below using the Surface-17 error correction code. As illustrated in FIG. 8, Surface-17 uses 42 single qubit gates, 24 two-qubit gates and a circuit depth of 8. Here, the number of gate levels to realize one full error correction cycle is considered to be the circuit depth. In the illustrated Surface-17 Code, a unit cell comprising 17 qubits is defined within the enclosed region 801.

Surface codes such as Surface-17 rely on ancilla or control qubits to protect the integrity of the data encoded in the data qubits. In FIG. 8, for example, the ancilla qubits within the unit cell 801 include Z-syndrome qubits Za, Zb, Zc, and Zd, and X-syndrome qubits Xa, Xb, Xc, and Xd. The data qubits include qubits Da, db, Dc, Dd, De, Df, Dg, Dh, and Di. The ancilla qubits Za-d and Xa-d can be measured without disturbing the quantum information encoded in the data qbits Da-i but still provide information related to the errors in the data qubits. In particular, the error syndrome data from the ancilla qubits can be used to determine whether a data qubit has been corrupted, and may identify the corrupted qubit. Further, the error syndrome code produced by a quantum decoder (e.g., such as decoding/error correction unit 516) in response to reading the ancilla qubits Za-d/Xa-d can identify not only the physical qubit which was affected, but also in which of several possible ways it was affected. In one embodiment, the X-syndrome qubits Xa-d and Z-syndrome qubits Za-d are used to differentiate between phase-flip syndromes (or "X-syndromes") and bit-flip syndromes (or "Z-syndromes"), respectively. Note, however, that the underlying principles of the invention are not limited to any particular coding scheme.

Figure 9:
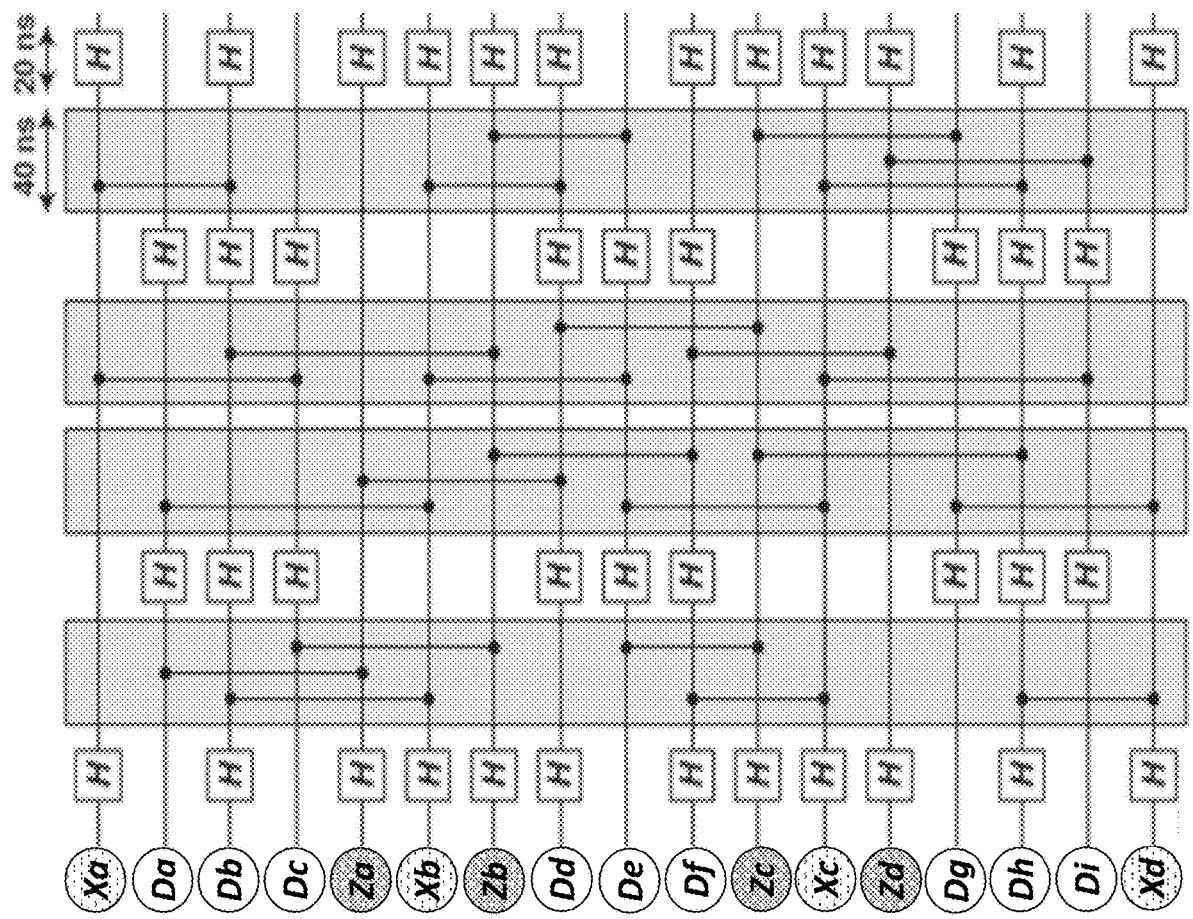
FIG. 9 illustrates an example of a quantum circuit in which single-qubit and two-qubit gate operations are performed per error correction cycle based on a Surface-17 Code.

FIG. 9 illustrates the single-qubit and two-qubit gate operations per error correction cycle in a Surface-17 Code, implemented using a plurality of Hadamard (H) gates, each of which operate on a single qubit. Hadamard gates map the basis state |0⟩ to (|0⟩+|1⟩)/sqrt[2] and |1⟩ to (|0⟩−|1⟩)/sqrt[2], meaning that a measurement will have equal probabilities to become 1 or 0 (i.e., creation of a superposition). It also represents a rotation of $\pi$ about the axis $(\hat{x}+\hat{z})/\sqrt{2}$ and is the combination of two rotations, $\pi$ about the Z-axis followed by $\pi/2$ about the Y-axis.

One embodiment of the invention generates a new quantum circuit specification comprising multi-qubit gates to realize the same error correction code. This embodiment utilizes 2-qubit gates, 3-qubit gates, 5-qubit gates, and 7-qubit gates that mimic the same error-correcting behavior. The required number of gates is 34 single qubit gates, and 8 multi-qubit gates. This embodiment reduces the circuit depth by half and the number of gates by approximately one-third.

Figure 10B:
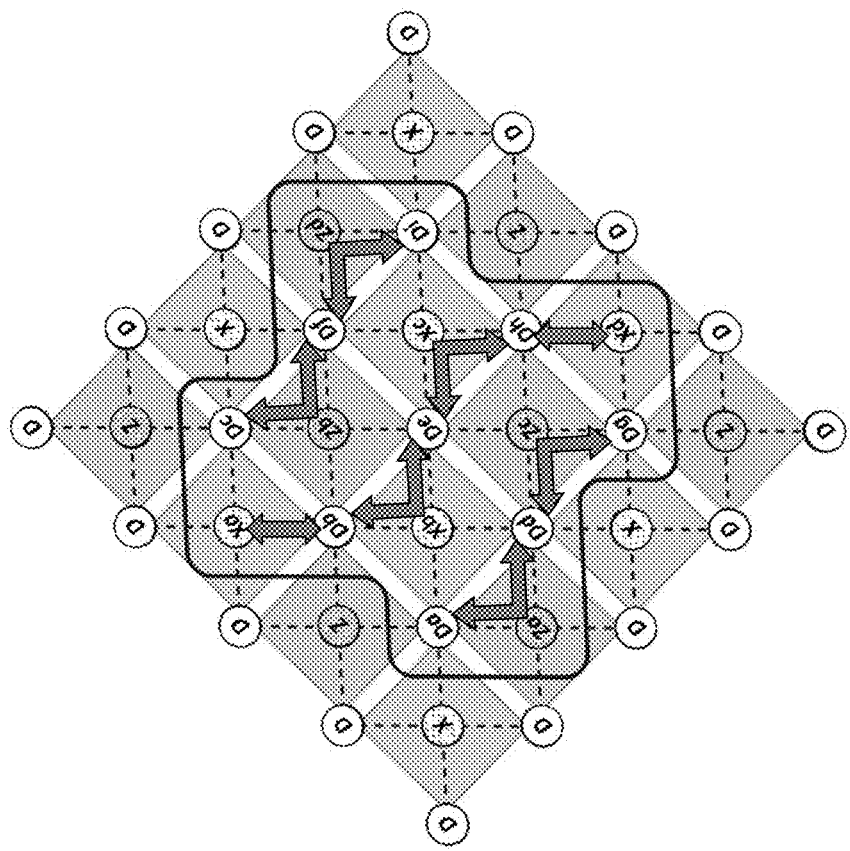
FIGS. 10A-B illustrate an example comprising two sequences of multi-qubit gate operations to realize a Surface-17 Code.
Figure 10A:
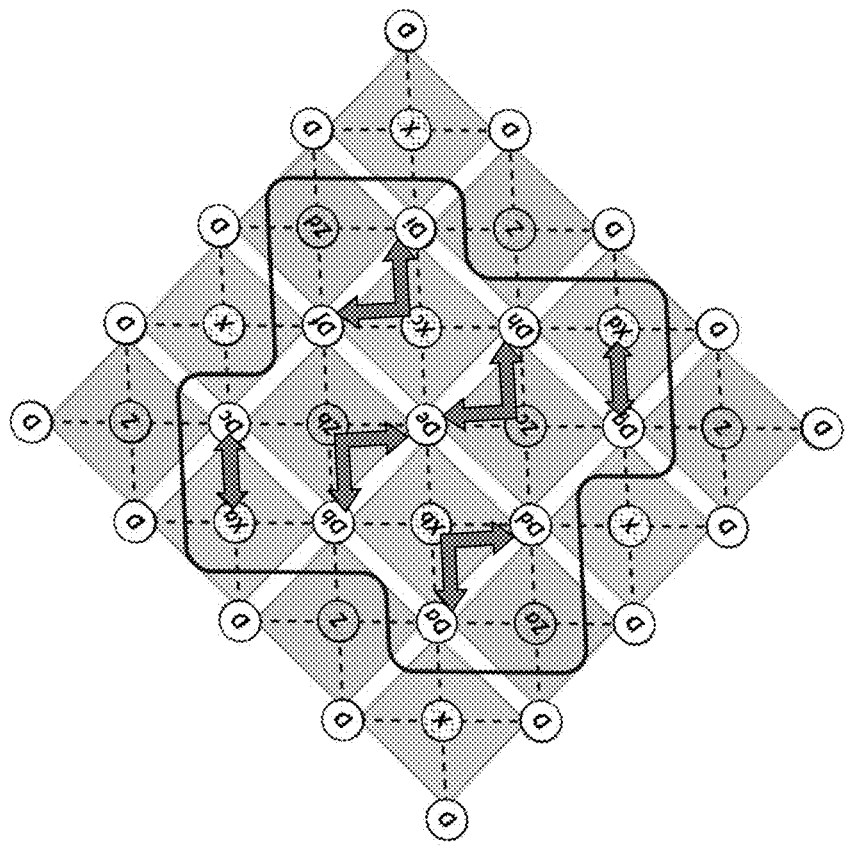

By way of example, and not limitation, FIG. 10A-B illustrate two sequences of multi-qubit gate operations to realize a Surface-17 Code. In the first cycle, shown in FIG. 10A, data qubit Xa is associated with ancilla qubit Dc, ancilla qubit Zb is associated with data qubits db and De, ancilla qubit Xc is associated with data qubits Di and Df, ancilla qubit Zc is associated with data qubits De and Dh, and ancilla qubit Xd is associated with data qubit Dg. In one embodiment, the ancilla qubits are used to detect and correct errors of their associated data qubits.

In the second cycle, illustrated in FIG. 10B, data qubit Xa is associated with ancilla bit db, ancilla qubit Zb is associated with data qubits Dc and Df, ancilla qubit Zd is associated with data qubits Df and Di, ancilla qubit Xb is associated with data qubits db and De, ancilla qubit Xc is associated with data qubits De and Dh, ancilla qubit Zc is associated with data qubits Dd and Dg, ancilla qubit Za is associated with data qubits Da and Dd, and ancilla qubit Xd is associated with data qubit Dh.

Figure 11:
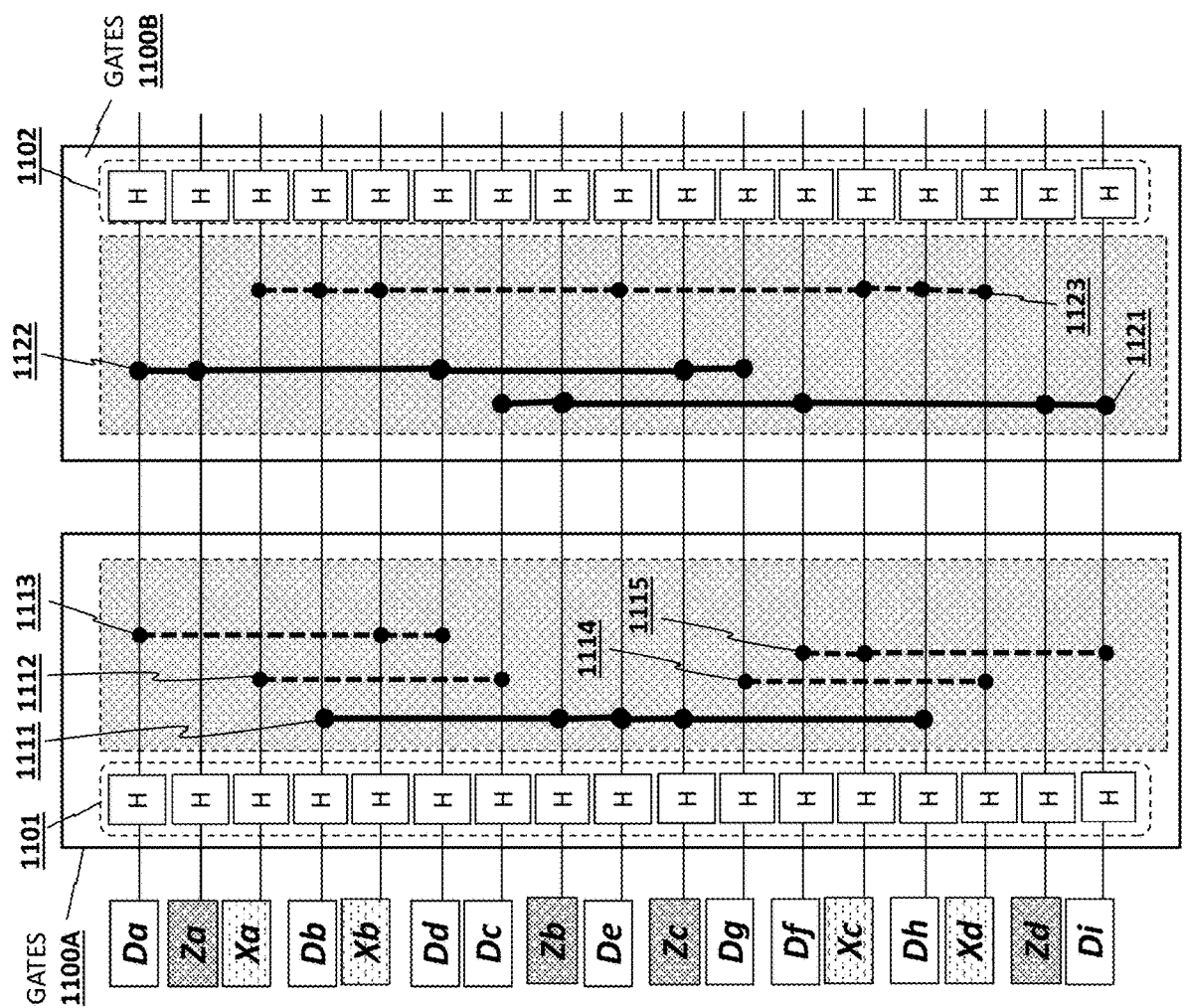
FIG. 11 illustrates one embodiment of the invention in which multi-qubit gate operations are used to reduce execution time.

FIG. 11 illustrates one embodiment of the single-qubit and multi-qubit gate operations per error correction cycle in a Surface-17 Code. In particular, a first set of gates 1100A implement the first sequence of multi-qubit gate operations shown in FIG. 10A and a second set of gates 1100B implement the multi-qubit gate operations shown in FIG. 10B. In particular, the first set of Hadamard gates 1101 are applied to the ancilla qubits and data qubits and the resulting outputs are applied to a series of N-qubit gates 1111-1115, 1121-1123 (where N>1) that execute the same functions of the circuit or sub-circuit more efficiently and/or mimic the desired error-correcting capabilities of a given error correction code.

In the specific example shown in FIG. 11, the gates include a 5-qubit parity detector gate 1111 applied to Hadamard-transformed qubits db, Zb, De, Zc, Dh; a 2-qubit parity detector gate 1112 applied to Hadamard-transformed qubits Xa and Dc; a 3-qubit parity detector gate 1113 applied to Hadamard-transformed qubits Da, Xb, and Dd; a 2-qubit parity detector gate 1114 applied to Hadamard-transformed qubits Dg and Zd, and a 3-qubit parity detector gate 1115 applied to Hadamard-transformed qubits Df, Xc, and Di. Significantly, the multi-qubit gates 1111-1115 within the first shaded region can all be implemented concurrently, resulting in a reduction in the circuit depth for the Surface-17 sequence.

Similarly, the second set of multi-qubit gates 1121-1123 within the second shaded region can all be implemented concurrently. In this embodiment, the second set of gates include a 5-qubit parity detector gate 1121, another 5-qubit parity detector gate 1122, and a 7-qubit parity detector gate 1123, all of which operate in parallel on different combinations of the qubits. The specific qubits used for each of the first and second sets of multi-qubit gates are indicated by the dots in FIG. 11 between different qubit lines with each gate 1111-1115, 1121-1123.

A second set of Hadamard gates 1102 perform a Hadamard transform on the resulting qubits following application of the second set of multi-qubit gates 1121-1123 to generate the final output. As mentioned, using multi-qubit gates, the entire sequence of quantum operations may be completed within 2 cycles and may operate in accordance with a specified error correction code.

Different sequences of one and two-qubit gates may require timescales that extend past the qubit coherence time. The above embodiments speed execution by replacing sub-circuits of an original quantum circuit with multi-qubit gates that preserve the functionality of the sub-circuit. For example, as described above with respect to FIG. 7, in one embodiment, the quantum circuit analyzer 710 evaluates the original quantum circuit specification, including sub-circuits, to identify potential replacement multi-qubit gates 750.

In certain implementations, the quantum circuit analyzer 710 also evaluates the error correction code to identify multi-qubit gates which implement the error correction code while improving the efficiency of the sub-circuit(s). To perform its analysis, one embodiment of the quantum circuit analyzer 710 relies on a quantum circuit database 760 which stores associations between different quantum circuits/sub-circuits and different multi-qubit gates and/or combinations of multi-qubit gates. In addition, different forms of error correction coding may be associated with different versions of the multi-qubit gates. Thus, while specific error correction codes are described herein, the underlying principles of the invention are not limited to any particular error correction codes.

In operation, when the quantum circuit analyzer 710 identifies a particular circuit/sub-circuit, it queries the quantum circuit database 760 to determine whether one or more replacement multi-qubit gate circuits exist (e.g., which would reduce the execution time and implement the appropriate error correction coding). The quantum circuit generator 720 then generates a new quantum circuit specification 750 which includes one or more of the sub-circuit(s) identified by the quantum circuit analyzer 710 (e.g., multi-qubit gates that mimic the behavior of the sub-circuit(s) in combination with the error correction code).

Figure 12:
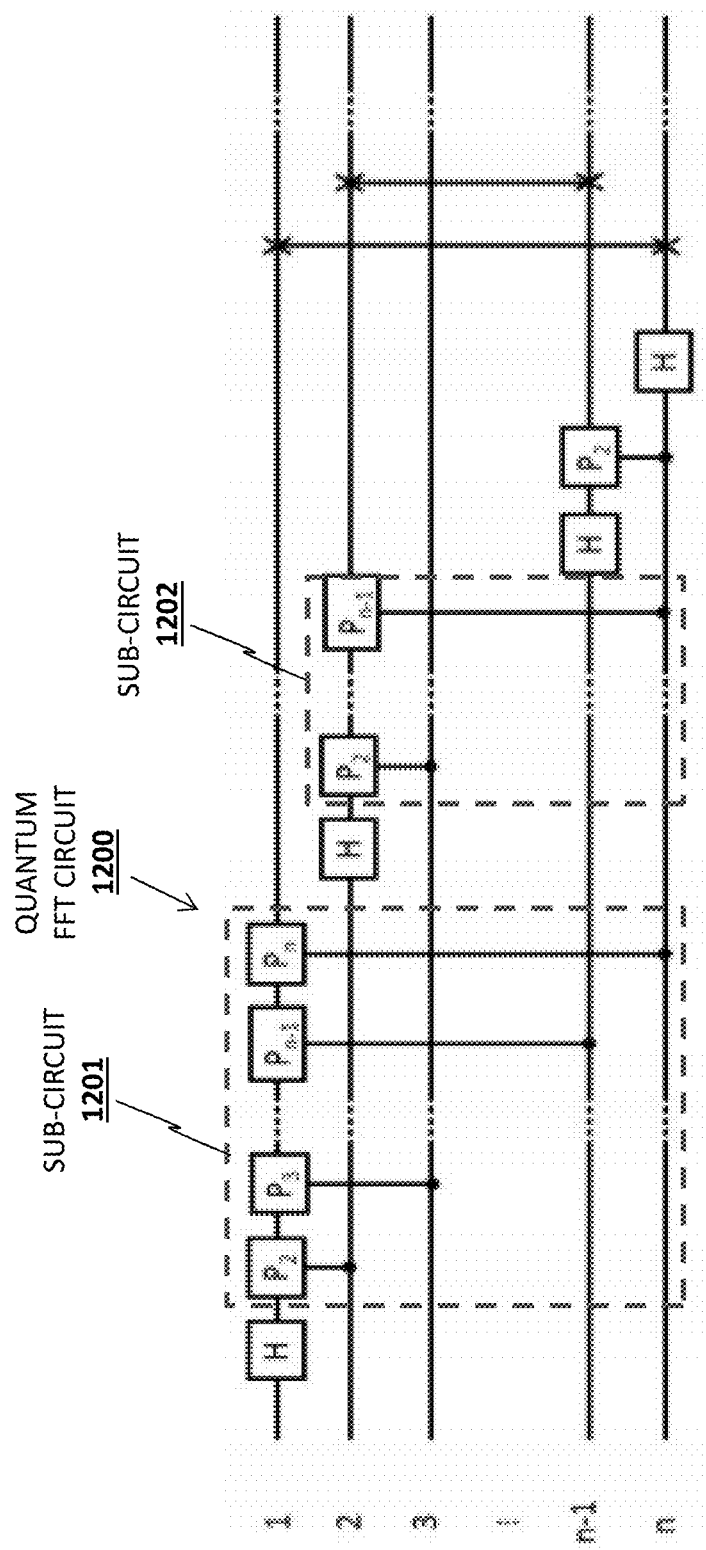
FIG. 12 illustrates one embodiment of a quantum Fast Fourier Transform (FFT) circuit.

By way of example, and not limitation, FIG. 12 illustrates an original quantum circuit 1200 for implementing the Quantum Fourier Transform algorithm which includes different sequences of controlled-phase gates (e.g., $P_2$, $P_3$, ... $P_{n-1}$, $P_n$). In this example, the quantum circuit analyzer 710, upon querying the quantum circuit database 760, determines that the two highlighted sub-circuits, 1201 and 1202, of the original quantum circuit 1200 can be replaced with multi-qubit gates. In one embodiment, the quantum circuit analyzer 710 specifically targets sub-circuits/gates in the original quantum circuit which are repeatedly applied (e.g., such as the controlled phase gates $P_2$, $P_3$, ... $P_{n-1}$, $P_n$ which are applied in series in FIG. 12).

Figure 13:
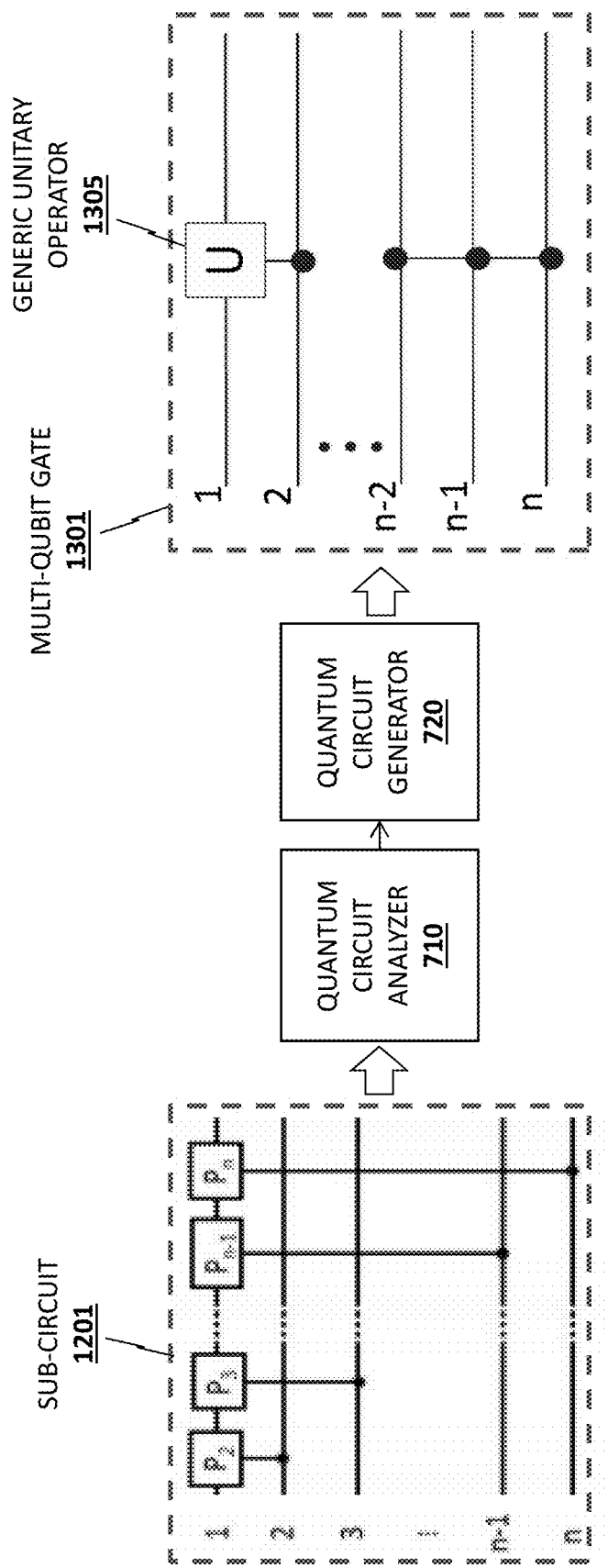
FIG. 13 illustrates an example in which a sub-circuit of the FFT circuit is analyzed and replaced by a circuit using multi-qubit gates.

FIG. 13 illustrates the first sub-circuit 1201 processed by the quantum circuit analyzer 710 and quantum circuit generator 720 to generate a multi-qubit gate 1301 in accordance with one embodiment of the invention. In this particular example, the first sub-circuit 1201 requires (2n−1) of 2-qubit gate operations. Consequently, the time required to implement this circuit is (2n−1) multiplied by each gate's duration time. To significantly reduce this timeframe, one embodiment of the quantum circuit generator 720 (responsive to the analysis of the quantum circuit analyzer 710) generates a new quantum circuit specification comprising a one shot multi-qubit gate 1301 operating within a significantly reduced timeframe which is independent of the number of qubits.

The illustrated one shot multi-qubit gate 1301 includes a generic unitary operator (U) 1305 and the lines connecting it to other qubits indicates that it is a generic multi-qubit gate operation. In one embodiment, the multi-qubit gate 1301 may be implemented for all relevant qubits (1, 2, ... n) in parallel. In contrast, the original sub-circuit 1201 operates serially on 2-qubit gates, consuming significantly more time to complete.

Figure 14:
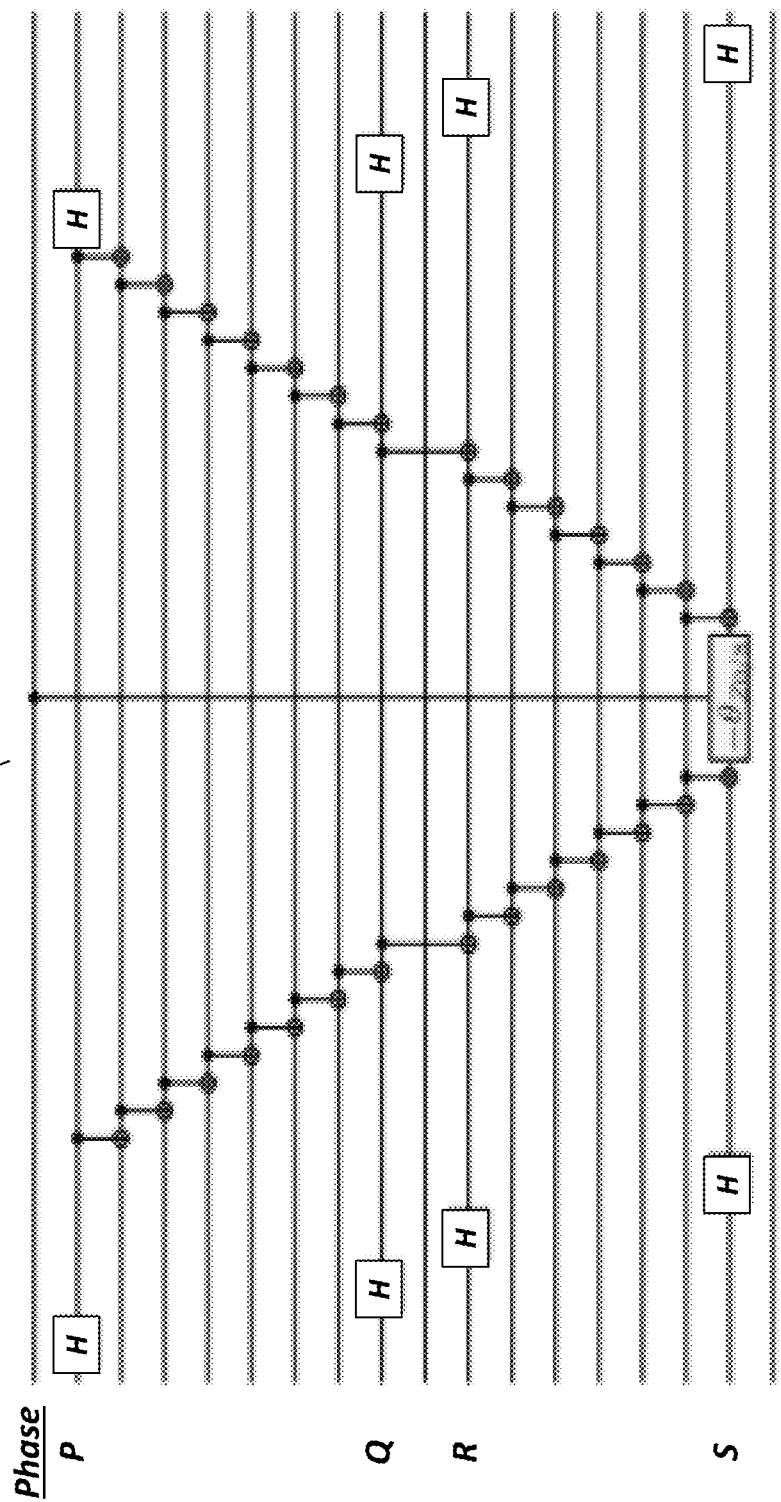
FIG. 14 illustrates a quantum circuit implementing the Jordan-Wigner transformation.

While the above example improves the efficiency of a particular quantum FFT circuit 1200, the same underlying principles may be applied to any other quantum circuit to generate a new quantum circuit specification comprising multi-qubit gates which reduce overall execution time. By way of another example, FIG. 14 illustrates a Jordan-Wigner transformation circuit 1401 which, in one embodiment, is replaced by a multi-qubit gate such as multi-qubit gate 1301 shown in FIG. 13.

Figure 15:
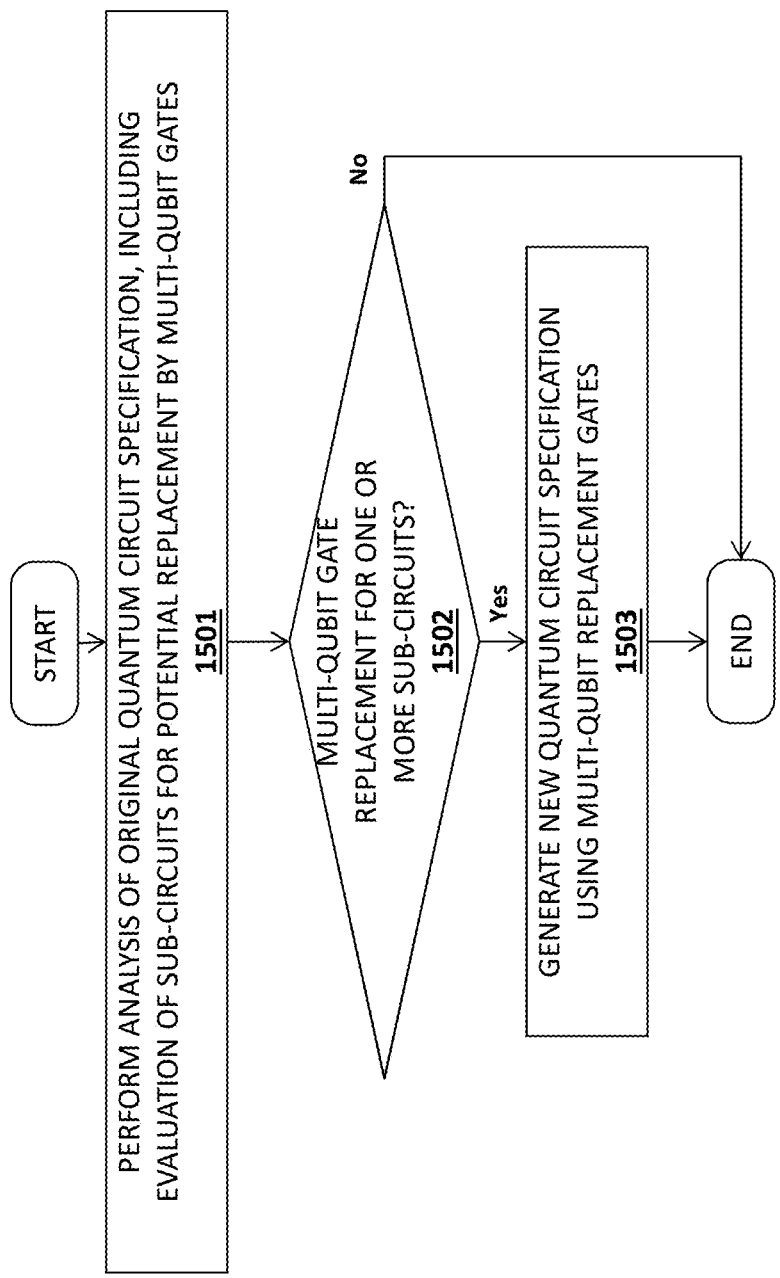
FIG. 15 illustrates a method in accordance with one embodiment of the invention.

A method in accordance with one embodiment of the invention is illustrated in FIG. 15. The method may be implemented on the architectures described above, but is not limited to any specific architecture or original quantum circuit.

At 1501 an analysis is performed of an original quantum circuit specification, including an evaluation of sub-circuits for potential replacement by multi-qubit gates. In one embodiment, the analysis includes querying a database of known circuits/sub-circuits to identify appropriate multi-qubit gates to be used for replacement. Alternatively, or in addition, a machine learning engine may evaluate the circuit/sub-circuit to identify one or more potential multi-qubit gates to be used for replacement. The machine learning engine may comprise any type of circuitry, program code, or combination thereof capable of progressively improving performance of a specified task or rendering progressively more accurate predictions or decisions without being explicitly programmed to perform the tasks or render the predictions/decisions. Various types of machine learning techniques be used including (but not limited to) supervised/semi-supervised learning, unsupervised learning, and reinforcement learning.

If one or more multi-qubit gates are identified as replacements for one or more sub-circuits, determined at 1502, then at 1503, a new quantum circuit specification is generated which includes the one or more multi-qubit gates. If not, then the process ends.

We would be able to tell infringement, if the quantum algorithm implementation time is at a much shorter timescale than expected and that is only weakly dependent on the number of qubits.

A method in accordance with one embodiment of the invention is illustrated in FIG. 15. The method may be implemented within the context of the system architectures described above, but is not limited to any particular system or processor architecture.

In the above detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments. Terms like "first," "second," "third," etc. do not imply a particular ordering, unless otherwise specified.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous.

Embodiments of the invention may include various steps, which have been described above. The steps may be embodied in machine-executable instructions which may be used to cause a general-purpose or special-purpose processor to perform the steps. Alternatively, these steps may be performed by specific hardware components that contain hard-wired logic for performing the steps, or by any combination of programmed computer components and custom hardware components.

As described herein, instructions may refer to specific configurations of hardware such as application specific integrated circuits (ASICs) configured to perform certain operations or having a predetermined functionality or software instructions stored in memory embodied in a non-transitory computer readable medium. Thus, the techniques shown in the figures can be implemented using code and data stored and executed on one or more electronic devices (e.g., an end station, a network element, etc.). Such electronic devices store and communicate (internally and/or with other electronic devices over a network) code and data using computer machine-readable media, such as non-transitory computer machine-readable storage media (e.g., magnetic disks; optical disks; random access memory; read only memory; flash memory devices; phase-change memory) and transitory computer machine-readable communication media (e.g., electrical, optical, acoustical or other form of propagated signals—such as carrier waves, infrared signals, digital signals, etc.).

In addition, such electronic devices typically include a set of one or more processors coupled to one or more other components, such as one or more storage devices (non-transitory machine-readable storage media), user input/output devices (e.g., a keyboard, a touchscreen, and/or a display), and network connections. The coupling of the set of processors and other components is typically through one or more busses and bridges (also termed as bus controllers). The storage device and signals carrying the network traffic respectively represent one or more machine-readable storage media and machine-readable communication media. Thus, the storage device of a given electronic device typically stores code and/or data for execution on the set of one or more processors of that electronic device. Of course, one or more parts of an embodiment of the invention may be implemented using different combinations of software, firmware, and/or hardware. Throughout this detailed description, for the purposes of explanation, numerous specific details were set forth in order to provide a thorough understanding of the present invention. It will be apparent, however, to one skilled in the art that the invention may be practiced without some of these specific details. In certain instances, well known structures and functions were not described in elaborate detail in order to avoid obscuring the subject matter of the present invention. Accordingly, the scope and spirit of the invention should be judged in terms of the claims which follow.

The invention claimed is:

1. An apparatus comprising:
  a quantum circuit analyzer to evaluate an original quantum circuit specification including one or more sub-circuits of the original quantum circuit specification, the quantum circuit analyzer to generate results of the evaluation; and
  a quantum circuit generator to generate a new quantum circuit specification based on the results of the evaluation generated by the quantum circuit analyzer, the quantum circuit generator to generate the new quantum circuit specification by, at least in part, replacing the one or more sub-circuits of the original quantum circuit specification with one or more multi-qubit gates.

2. The apparatus of claim 1 wherein the results of the evaluation comprise an indication of the one or more multi-qubit gates to be used to replace the one or more sub-circuits.

3. The apparatus of claim 2 wherein the quantum circuit analyzer is to further evaluate a specified quantum error correction code to generate the results, wherein the one or more multi-qubit gates are selected by the quantum circuit analyzer to implement the specified quantum error correction code.

4. The apparatus of claim 1 further comprising:
  a quantum circuit database to store data associating a plurality of quantum circuit/sub-circuit specifications with a plurality of multi-qubit gates;
  wherein the quantum circuit analyzer is to query the quantum circuit database as part of its evaluation of the original quantum circuit specification to generate the results.

5. The apparatus of claim 1 wherein the quantum circuit analyzer is to select the one or more sub-circuits of the original quantum circuit specification for replacement by the one or more multi-qubit gates based on the one or more sub-circuits having gates which are repeatedly applied in series.

6. The apparatus of claim 5 wherein all of the gates of a first multi-qubit gate selected by the quantum circuit analyzer are capable of being implemented in parallel.

7. The apparatus of claim 6 wherein the first multi-qubit gate is operable on a set of data qubits and a set of ancilla qubits.

8. The apparatus of claim 7 wherein the set of ancilla qubits are to protect data integrity of the data qubits.

9. A method comprising:
  evaluating an original quantum circuit specification including one or more sub-circuits of the original quantum circuit specification to generate results identifying one or more multi-qubit gates; and
  generating, by a quantum circuit generator, a new quantum circuit specification based on the results, the new quantum circuit specification comprising the one or more sub-circuits of the original quantum circuit specification replaced with the one or more multi-qubit gates.

10. The method of claim 9 wherein the results of the evaluation comprise an indication of the one or more multi-qubit gates to be used to replace the one or more sub-circuits.

11. The method of claim 10 wherein evaluating further comprises:
analyzing a specified quantum error correction code to generate the results, wherein the one or more multi-qubit gates are selected in view of the specified quantum error correction code.

12. The method of claim 9 further comprising:
storing data in a database associating a plurality of quantum circuit/sub-circuit specifications with a plurality of multi-qubit gates;
wherein evaluating further comprises querying the database to generate the results.

13. The method of claim 9 wherein the one or more sub-circuits of the original quantum circuit specification are selected for replacement by the one or more multi-qubit gates based on the one or more sub-circuits having gates which are repeatedly applied in series.

14. The method of claim 13 wherein all of the gates of a first multi-qubit gate are capable of being implemented in parallel.

15. The method of claim 14 wherein the first multi-qubit gate is operable on a set of data qubits and a set of ancilla qubits.

16. The method of claim 15 wherein the set of ancilla qubits are to protect data integrity of the data qubits.

17. A non-transitory machine-readable medium having program code stored thereon which, when executed by a machine, causes the machine to perform the operations of:
evaluating an original quantum circuit specification including one or more sub-circuits of the original quantum circuit specification to generate results identifying one or more multi-qubit gates; and
generating, by a quantum circuit generator, a new quantum circuit specification based on the results, the new quantum circuit specification comprising the one or more sub-circuits of the original quantum circuit specification replaced with the one or more multi-qubit gates.

18. The non-transitory machine-readable medium of claim 17 wherein the results of the evaluation comprise an indication of the one or more multi-qubit gates to be used to replace the one or more sub-circuits.

19. The non-transitory machine-readable medium of claim 18 wherein evaluating further comprises:
analyzing a specified quantum error correction code to generate the results, wherein the one or more multi-qubit gates are selected in view of the specified quantum error correction code.

20. The non-transitory machine-readable medium of claim 17 further comprising:
storing data in a database associating a plurality of quantum circuit/sub-circuit specifications with a plurality of multi-qubit gates;
wherein evaluating further comprises querying the database to generate the results.

21. The non-transitory machine-readable medium of claim 17 wherein the one or more sub-circuits of the original quantum circuit specification are selected for replacement by the one or more multi-qubit gates based on the one or more sub-circuits having gates which are repeatedly applied in series.

22. The non-transitory machine-readable medium of claim 21 wherein all of the gates of a first multi-qubit gate are capable of being implemented in parallel.

23. The non-transitory machine-readable medium of claim 22 wherein the first multi-qubit gate is operable on a set of data qubits and a set of ancilla qubits.

24. The non-transitory machine-readable medium of claim 23 wherein the set of ancilla qubits are to protect data integrity of the data qubits.

* * * * *